United States Patent
Ha et al.

(10) Patent No.: US 11,424,613 B2
(45) Date of Patent: Aug. 23, 2022

(54) UNIVERSAL TRAVELING-WAVE-BASED PROTECTION AND FAULT LOCATION FOR POWER SYSTEM

(71) Applicant: General Electric Technology GmbH, Baden (CH)

(72) Inventors: Hengxu Ha, Stafford (GB); Mitalkumar Kanabar, Markham (CA); Adriano Oliveira Pires, Florianópolis (BR); Elias Bencz, Florianópolis (BR); Lucas Barcelos de Oliveira, Sydney (AU)

(73) Assignee: General Electric Technology Gmbh, Baden (CH)

( * ) Notice: Subject to any disclaimer, the term of this patent is extended or adjusted under 35 U.S.C. 154(b) by 248 days.

(21) Appl. No.: 16/292,791

(22) Filed: Mar. 5, 2019

(65) Prior Publication Data

US 2020/0287377 A1    Sep. 10, 2020

(51) Int. Cl.
| | | |
|---|---|---|
| H02H 7/26 | (2006.01) | |
| H02H 1/00 | (2006.01) | |
| G01R 19/25 | (2006.01) | |

(52) U.S. Cl.
CPC ......... *H02H 7/265* (2013.01); *G01R 19/2513* (2013.01); *H02H 1/0007* (2013.01); *H02H 1/0092* (2013.01)

(58) Field of Classification Search
CPC .... H02H 7/265; H02H 2/0092; H02H 1/0007; H02H 1/00; H02H 7/26; H02H 1/0092; G01R 19/2513; G01R 19/19; G01R 19/25
See application file for complete search history.

(56) References Cited

U.S. PATENT DOCUMENTS

| | | |
|---|---|---|
| 8,742,765 B2 | 6/2014 | Kojovic et al. |
| 8,990,036 B1 | 3/2015 | Schweitzer, III et al. |

(Continued)

FOREIGN PATENT DOCUMENTS

| | | |
|---|---|---|
| CN | 107247214 A | 10/2017 |
| EP | 1787135 B1 | 5/2007 |

(Continued)

OTHER PUBLICATIONS

Alberto Bourghetti et al. "Continuous-Wavelet Transform for Fault location in Distribution Power Networks: Definition of Mother Wavelets Inferred From Fault Originated Transients" May 2008, IEEE, vol. 23, No. 2 (Year: 2008).*

(Continued)

*Primary Examiner* — Scott Bauer
(74) *Attorney, Agent, or Firm* — Eversheds Sutherland (US) LLP

(57) ABSTRACT

The technology described herein is generally directed towards a system for power transmission system protection and fault location, such as implemented in a deployable device at one or more junction points of a power transmission system. Aspects of the described technology can be directed to analyzing a traveling wave corresponding to a fault on a power transmission system. Example aspects can comprise receiving data representing current and voltage components of a traveling wave, maintaining the data in storage for fault location determination of the fault, transforming the data via a wavelet transform, into wavelet transform results and using the wavelet transform results for protection of the power transmission system.

18 Claims, 25 Drawing Sheets

(56) References Cited

U.S. PATENT DOCUMENTS

| | | | |
|---|---|---|---|
| 9,470,748 B2* | 10/2016 | Schweitzer, III | H02H 7/20 |
| 9,588,168 B2 | 3/2017 | Schweitzer, III et al. | |
| 9,774,388 B2 | 9/2017 | Kasztenny et al. | |
| 9,784,783 B2 | 10/2017 | Seibel et al. | |
| 10,581,237 B2* | 3/2020 | Schweitzer, III | G01R 31/085 |
| 2013/0015878 A1* | 1/2013 | Perera | H02H 7/265 |
| | | | 324/764.01 |
| 2013/0051498 A1* | 2/2013 | Taft | G01R 19/2513 |
| | | | 375/340 |
| 2015/0309096 A1* | 10/2015 | Choi | G01R 21/133 |
| | | | 702/60 |
| 2016/0266192 A1 | 9/2016 | Burek et al. | |
| 2018/0024183 A1 | 1/2018 | Liu et al. | |
| 2018/0034258 A1 | 2/2018 | Schweitzer, III et al. | |

FOREIGN PATENT DOCUMENTS

| | | |
|---|---|---|
| EP | 3285078 A1 | 2/2018 |
| WO | 2014/101657 A1 | 7/2014 |
| WO | 2015081826 A1 | 6/2015 |
| WO | 2018022462 A1 | 2/2018 |

OTHER PUBLICATIONS

Partial Search Report issued in European Patent Application No. 20170452.5, dated Oct. 27, 2020, 32 pages.

Response to partial Search Report filed in European Patent Application No. 20170452.5, dated Jan. 5, 2021, 3 pages.

Borghetti, A., et al. "On the use of continuous-wavelet transform for fault location in distribution power systems," International Journal of Electrical Power & Energy Systems, Jordan Hill, Oxford GB, vol. 28, No. 9, Nov. 1, 2006 (Nov. 1, 2006), pp. 608-617.

Extended European Search Report issued in European Patent Application No. 20170452.5, dated Feb. 8, 2021, 17 pages.

* cited by examiner

US 11,424,613 B2

UNIVERSAL TRAVELING-WAVE-BASED PROTECTION AND FAULT LOCATION FOR POWER SYSTEM

TECHNICAL FIELD

This disclosure generally relates to power systems, and more particularly to traveling-wave-based fault location and protection in a power transmission platform.

BACKGROUND

Faults in electric power systems can occur on power transmission lines for various reasons, including short-circuits, lightning, damage to a transmission line tower or utility pole, damage to the transmission lines (e.g., from ice, wind, falling trees/tree branches) and so forth. When a fault occurs in an electric power system, traveling waves that travel at a very high velocity, close to the speed of light, are launched from the fault location.

A fault at one location on a power transmission line can result in problems at other locations. Protection against such ensuing problems can be based on detection of such traveling waves, e.g. to trip one or more relays before the fault can cascade into a system-wide disturbance that causes widespread outages. Fault location that determines where a fault occurred is also possible based on traveling wave detection, and is valuable for protection to isolate faults as well as for locating the problem that caused the fault to facilitate repair.

BRIEF DESCRIPTION OF THE DRAWINGS

The technology described herein is illustrated by way of example and not limited in the accompanying figures in which like reference numerals indicate similar elements and in which.

DETAILED DESCRIPTION

Various aspects of the technology described herein are generally directed towards a system, such as implemented in a device, that uses traveling waves for power transmission system and fault location. In one implementation, the system comprises fast traveling wave sampling for a traveling wave analyzer for ultra-high-speed (e.g., less than one millisecond) protection functionalities in a transmission relay platform. In one implementation, the system facilitates accurate traveling-wave-based fault location, (e.g., less than 120 meters if the sampling rate is on the order of 5 megahertz).

As will be understood, the universal traveling-wave-based fault locator and ultra-high-speed protection, where the both the double-ended and single-ended fault location scheme, as well as all kind of traveling wave based ultra-high-speed protection, such as, traveling-wave-based distance, traveling-wave-based direction, traveling-wave-based polarization comparison protection, traveling-wave differential and traveling-wave-based boundary protection.

It should be understood that any of the examples herein are non-limiting. As such, the technology described herein is not limited to any particular implementations, embodiments, aspects, concepts, structures, functionalities or examples described herein. Rather, any of the implementations, embodiments, aspects, concepts, structures, functionalities or examples described herein are non-limiting, and the technology may be used in various ways that provide benefits and advantages in transmission power system and fault location concepts in general.

Figure 1:
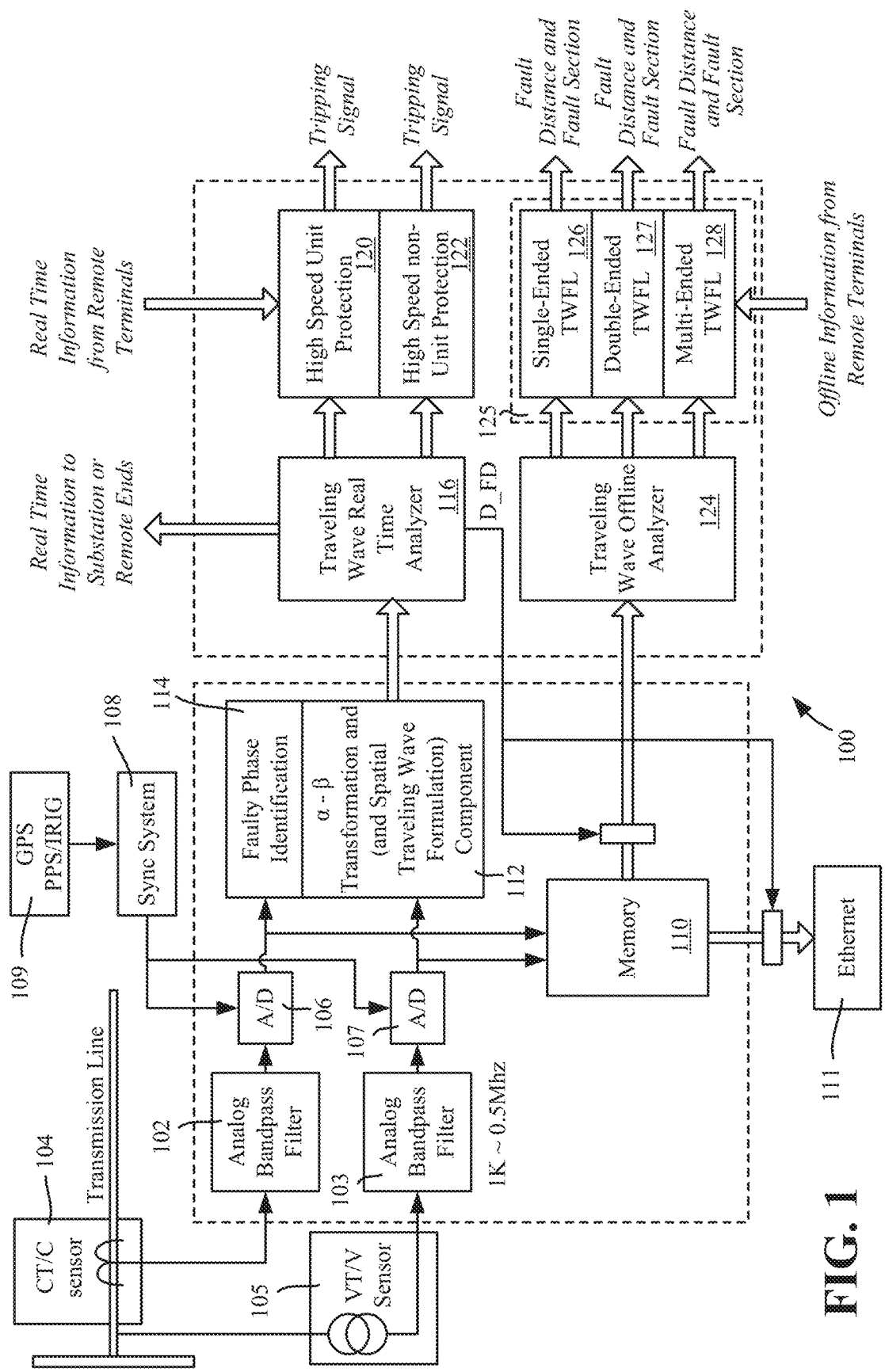
FIG. 1 is an example block diagram representation of an overall scheme of a universal traveling-wave-based protection and fault location device, in accordance with one or more example implementations of the subject matter disclosed herein of the subject matter disclosed herein.
Figure 18:
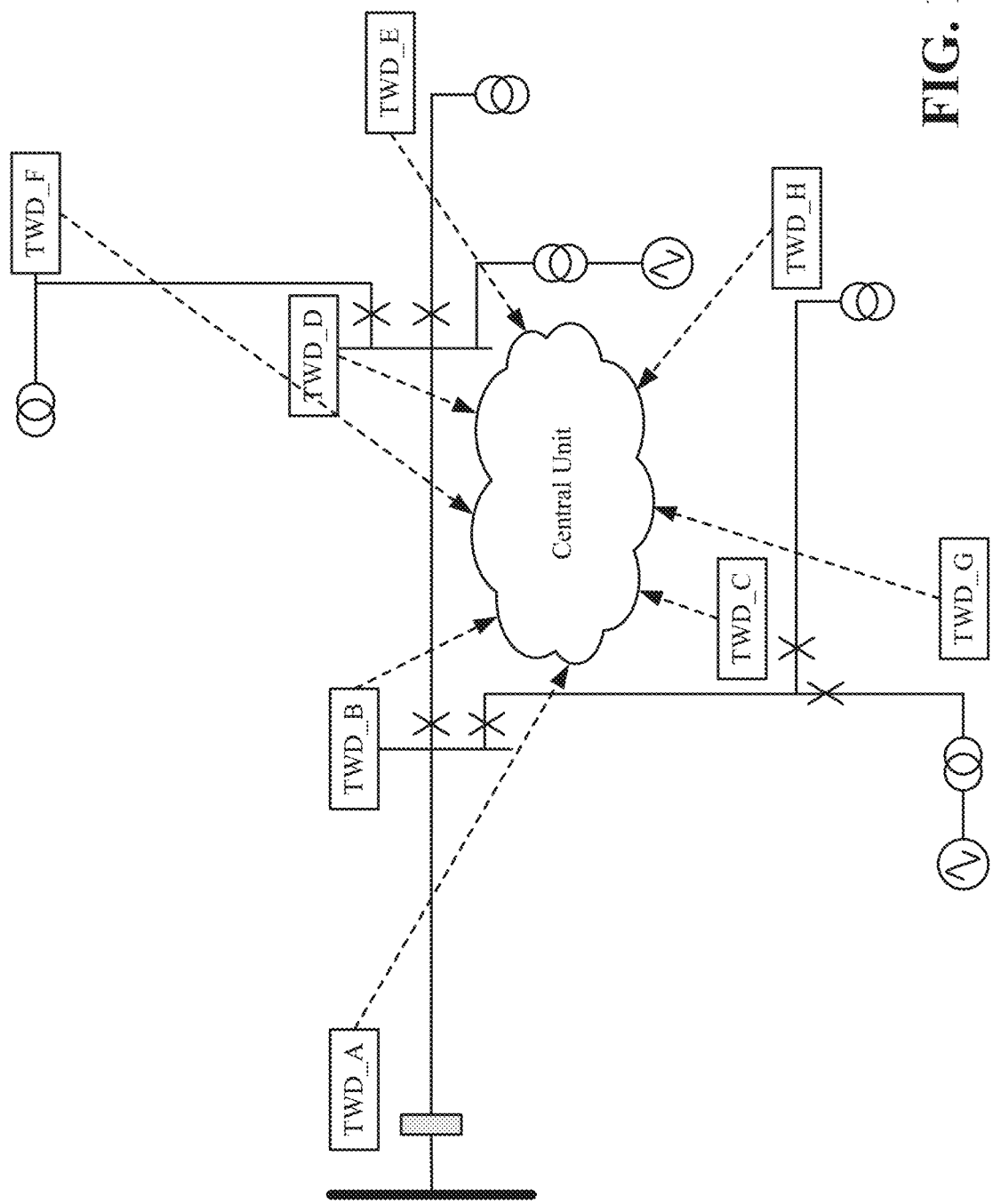
FIG. 18 is a representation of a multi-ended system in which various example aspects of the disclosed subject matter, including multi-ended fault location, may be practiced.

FIG. 1 depicts an example universal traveling wave-based protection and fault location system 100, most of which, for example, can be implemented in a traveling wave device that can be located at various locations in a power system (as in FIG. 18, for example). In general and as represented in FIG. 1, band-pass filters 102 and 103 are used for extracting a transient traveling wave from a transmission line as provided by a current transformer/current sensor 104 and voltage transformer/voltage sensor 105, respectively. The band-pass filters 102 and 103 remove the fundamental frequency and lower frequency components; if analog bandpass filters are used as in FIG. 1, analog-to-digital (A/D) converters 106 and 107, respectively, are used to sample/digitize the extracted traveling wave.

More particularly, because the traveling wave is superposed on the fundamental frequency, to extract the traveling wave more accurately, bandpass filtering is used for removing the fundamental frequency and lower frequency components, as well as for avoiding the aliasing that exists before the respective A/D acquires the samples. The cutting frequency band of the bandpass filter typically can be [1000 Hz, fs/2], where fs is the sampling frequency of the A/D converter; for example, if the sampling frequency is 1 MHz, the frequency band of the bandpass filter is [1000, 500000]. Note that, for example, a 3-order Butterworth bandpass filter can be used.

Thus, after the analog band pass filter extracts the traveling waves from the superposed fundamental frequency and lower frequency components, the transient traveling waves (of current and voltage) are sampled by the A/Ds 106 and 107, which are controlled by a synchronization system 108 (in conjunction with a GPS PPS/IRIG component 109 (global positioning system Inter-range instrumentation group/pulse per second)) to time synchronize the samples for the purpose of double-ended/multi-ended fault location and/or traveling wave based differential protection, as described herein. Note that the traveling wave samples (voltages and currents) are buffered in a memory 110. Once a fault/oscillation on the power system is detected, the produced fault detection signal freezes the buffer, and thereby sends a snapshot of the samples to an off-line fault location subsystem (e.g., transmitted via an Ethernet connection 111 or the like).

Figure 2:
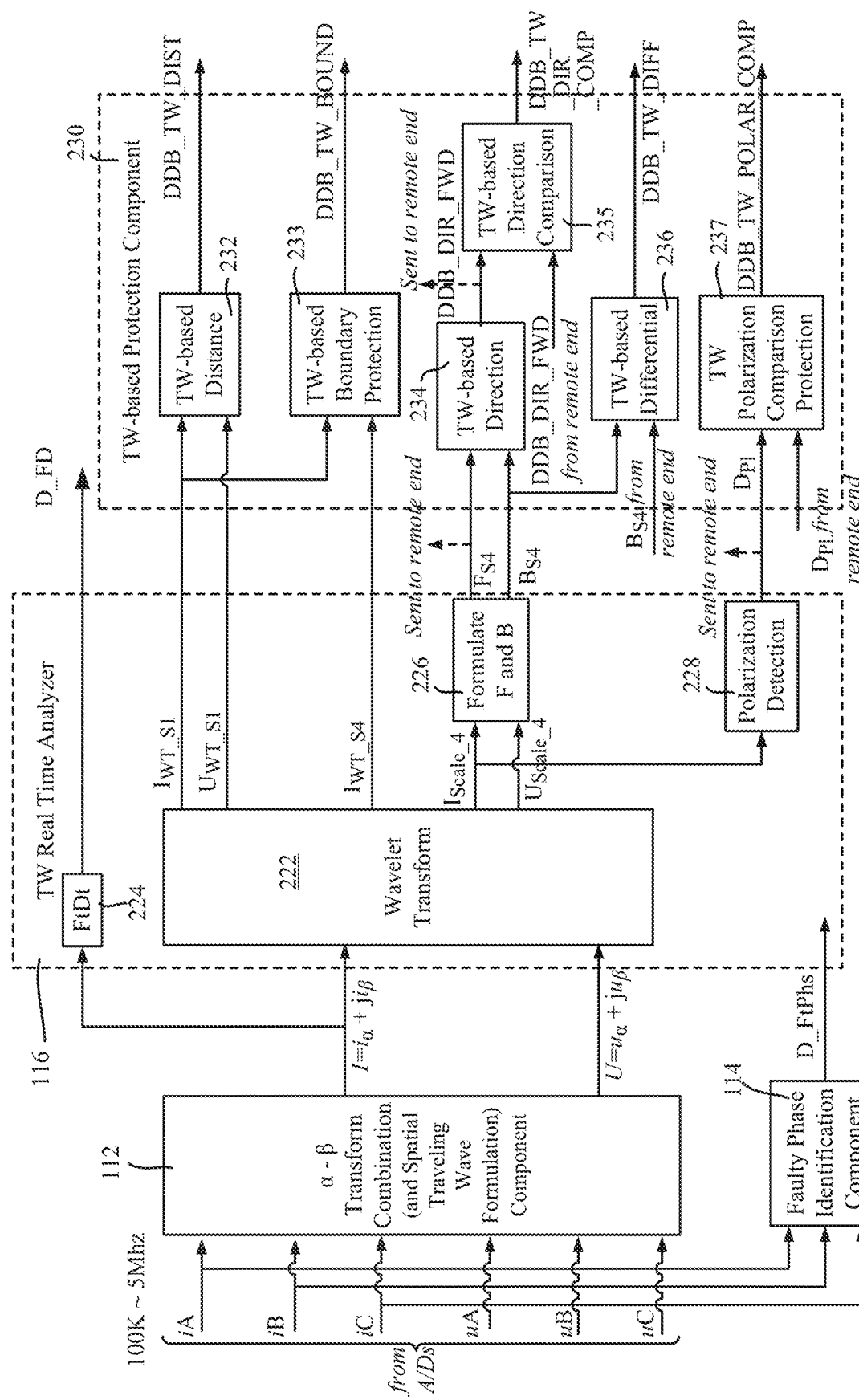
FIG. 2 is a block diagram representation of example details of a traveling-wave-based analyzer, in accordance with one or more example implementations of the subject matter disclosed herein.

As shown in FIGS. 1 and 2, an α-β transformation is used for reflecting various types of faults by one set of spatial vector of traveling wave. More particularly, in order to effectively respond to the various types of fault, an α-β transform is used for transferring the three-phase voltage and current samples into α and β components, which are then combined to be a complex spatial vector of traveling waves. The alpha mode tends to represent three phase traveling waves corresponding to ground faults, and can be calculated for phases A, B, and C, providing three alpha modes. The beta mode tends to represent three phase traveling waves corresponding to phase-to-phase faults, and can be obtained for phase combinations, that is, phases A and B, B and C, or C and A, providing three beta modes.

The inputs to the α-β transformation and spatial traveling wave formulation component 112 comprise the measured three phase voltages and currents; the outputs of the component 112 comprise a vector (U) of voltage traveling wave and a vector (I) of current traveling wave I. Equations for formulating the spatial vectors are shown below.

$$\begin{cases} u_\alpha = u_a - \frac{1}{2}u_b - \frac{1}{2}u_c \\ u_\beta = \frac{\sqrt{3}}{2}u_b - \frac{\sqrt{3}}{2}u_c \end{cases} \quad (1)$$

$$U = u_\alpha + j*u_\beta \quad (2)$$

$$\begin{cases} i_\alpha = i_a - \frac{1}{2}i_b - \frac{1}{2}i_c \\ i_\beta = \frac{\sqrt{3}}{2}i_b - \frac{\sqrt{3}}{2}i_c \end{cases} \quad (3)$$

$$I = i_\alpha + j*i_\beta \quad (4)$$

Faulty phase identification is performed by a faulty phase identification component 114. The spatial vectors based on phases A, B and C, respectively, are used for identifying the faulty phase. More particularly, the inputs to the faulty phase identification component 114 comprise three phase currents, while the output of the faulty phase identification component 114 comprises the digital signal of the faulty phase, D_ftPhs, where the following values of D_ftPhs are shown accompanied by their representative meanings (e.g., as determined via the logic of FIG. 4):

D_ftPhs=0, no fault or failed of identification;
D_ftPhs=1, phase A to ground fault;
D_ftPhs=2, phase B to ground fault;
D_ftPhs=3, phase C to ground fault;

D_ftPhs=4, phase B to phase C to ground fault;
D_ftPhs=5, phase C to phase A to ground fault;
D_ftPhs=6, phase A to phase B to ground fault;
D_ftPhs=7, phase B to phase C fault;
D_ftPhs=8, phase C to phase A fault;
D_ftPhs=9, phase A to phase B fault;
D_ftPhs=10, phase ABC fault or phase ABC to ground fault.

The complex spatial vector of traveling waves based on phases A, B and C, respectively, are made, by which the faulty phase can be identified by comparing the imaginary and real part of the spatial vectors.

Figure 3:
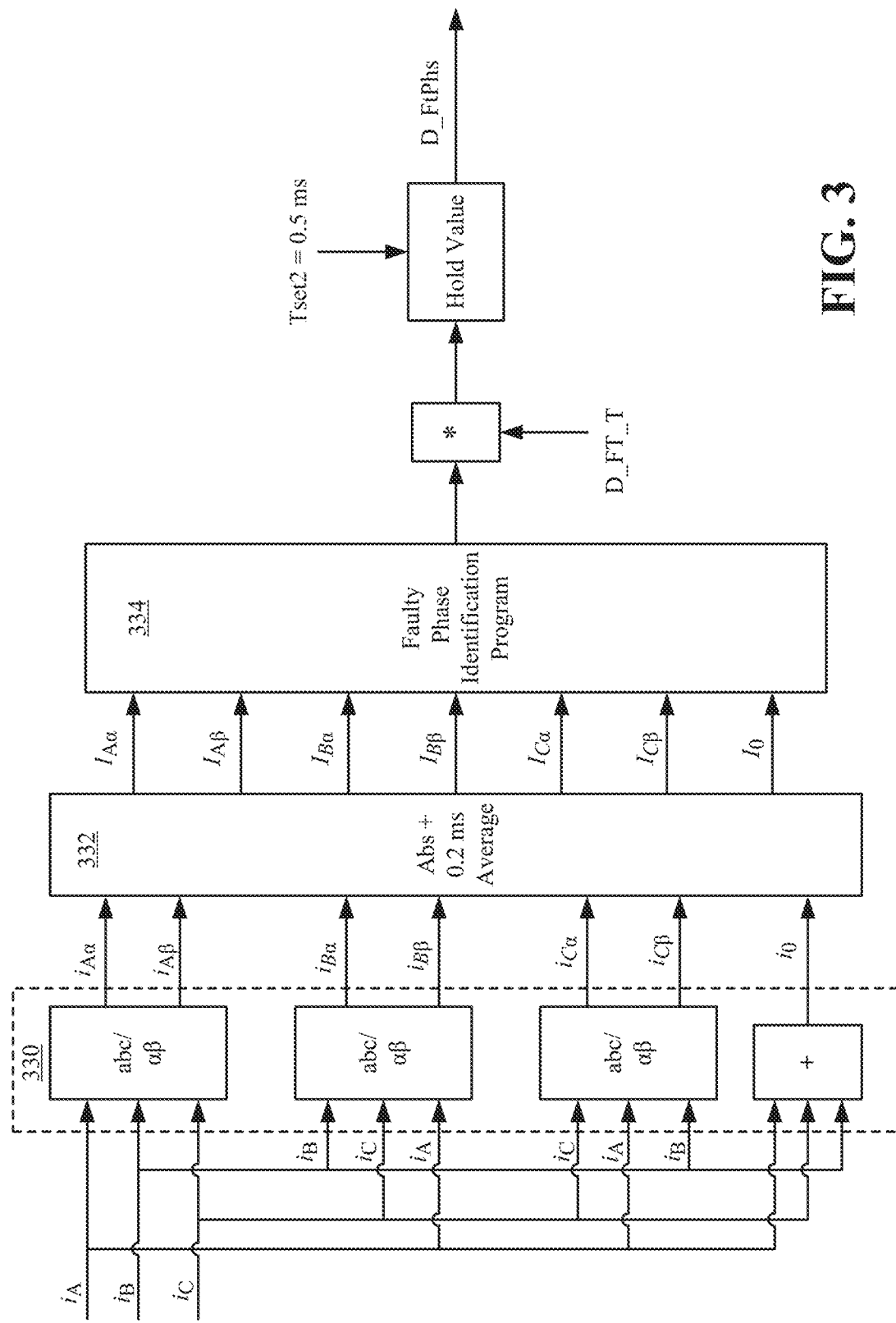
FIG. 3 is block diagram representing various example aspects of faulty phase identification, in accordance with one or more example implementations of the subject matter disclosed herein.

In one or more implementations, the components for the traveling-wave-based faulty phase identification can be separated into three general parts as generally shown in FIG. 3. A first part 330 comprises an α-β transformation based on phases A, B and C, respectively. A second part 332 comprises the absolute value of the α-β transformation adding an average filter in a time window, for example, 0.2 ms. A third part 334 comprises a faulty phase identification program, as further described with reference to the example operations of FIG. 4.

The following equations show how the α-β transformation is taken based on phases A, B and C respectively, as well as how the zero-mode current is calculated (α-β-0):

$$\begin{cases} i_{A\alpha} = i_a - \frac{1}{2}i_b - \frac{1}{2}i_c \\ i_{A\beta} = \frac{\sqrt{3}}{2}i_b - \frac{\sqrt{3}}{2}i_c \end{cases} \quad (5)$$

$$\begin{cases} i_{B\alpha} = i_b - \frac{1}{2}i_c - \frac{1}{2}i_a \\ i_{B\beta} = \frac{\sqrt{3}}{2}i_c - \frac{\sqrt{3}}{2}i_a \end{cases} \quad (6)$$

$$\begin{cases} i_{C\alpha} = i_c - \frac{1}{2}i_a - \frac{1}{2}i_b \\ i_{C\beta} = \frac{\sqrt{3}}{2}i_a - \frac{\sqrt{3}}{2}i_b \end{cases} \quad (7)$$

$$i_0 = \frac{i_A + i_B + i_C}{3} \quad (8)$$

The absolute value and average filter component 332 takes the absolute value of the α-β-0 values, and passes the absolute value through an average filter with time window Tav, where Tav=0.2 ms for example. The average filter is shown in equation 9, where N=Tav/Ts, where Ts is the sampling period:

$$I_{TW_{av}}(n) = \frac{1}{N}I_{TW_{av}}(n) + \frac{N-1}{N}I_{TW_{amp}} \quad (9)$$

Figure 4:
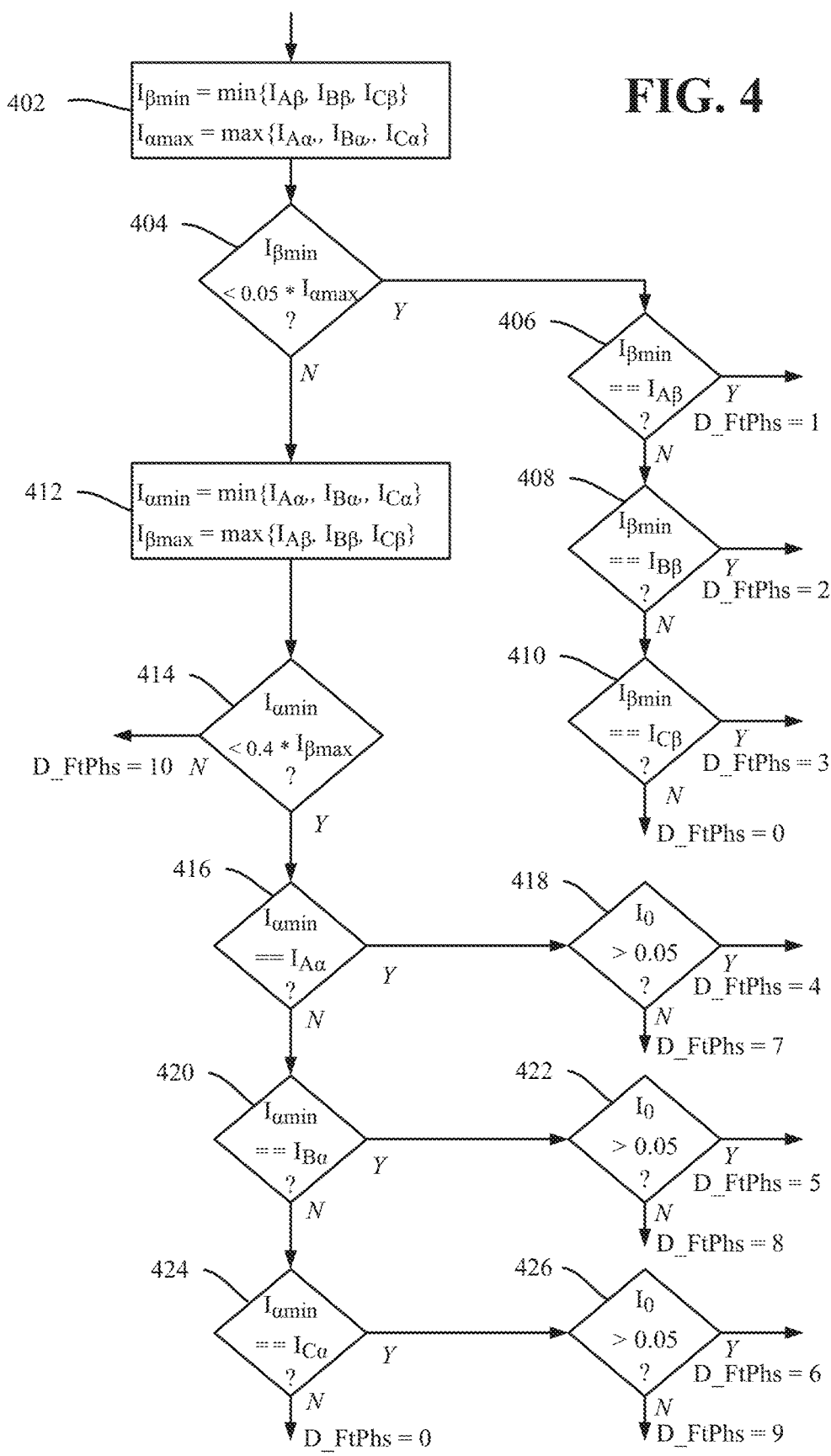
FIG. 4 is a flow diagram showing example operations related to performing faulty phase identification, in accordance with one or more example implementations of the subject matter disclosed herein.

Operations of the faulty phase identification program are represented in the flow diagram of FIG. 4. As can be seen, $I_{\beta min}$ and $I_{\alpha max}$ are computed at operation 402, and then evaluated via operation 404. If $I_{\beta min}$ is less than $0.05 * I_{\alpha max}$, the operations 406, 408 and 410 determine the value of D_FtPhs as 0, 1, 2 or 3, depending on a comparison of $I_{\beta min}$ against $I_{A\beta}$, $I_{B\beta}$ and $I_{C\beta}$, respectively, as needed.

Otherwise operation 404 branches to operation 412, where $I_{\alpha min}$ and $I_{\beta max}$ are determined, and evaluated at operation 414. For brevity, the various operations labeled 414-426 are not individually described, but as can be seen in FIG. 4, the various possible outcomes for D_ftPhs depending on $I_{\alpha min}$ versus $I_{A\alpha}$, $I_{B\alpha}$ and $I_{C\alpha}$ and/or $I_0$ (as needed), result in D_ftPhs equal to 0 or any of 4-9.

Returning to FIGS. 1 and 2, a traveling wave (TW) analyzer 116 is used for extracting the necessary information for various types of protections, such as, traveling-wave-based distance, traveling-wave-based direction, traveling-wave-based differential, traveling-wave-based boundary protection, and so on, by use of a wavelet transform 222 (FIG. 2).

Protection, described below, is represented in FIG. 1 by a high speed unit protection component 120 and a high speed non-unit protection component 122. Also represented in FIG. 1, and also described below, is fault location based on traveling waves. A travelling wave offline analyzer 124 couples to a single-ended traveling wave fault location (TWFL) component 126, a double-ended traveling wave fault location (TWFL) component 127 and a multi-ended traveling wave fault location (TWFL) component 128.

For analyzing the wave, as shown in FIG. 2, the inputs to the traveling wave analyzer 116 can comprise the voltage traveling wave vector U and current vector I. The outputs of the traveling wave analyzer 116 comprise the following:

(1) The digital signal of fault detection, identified as D_FD; if D_FD=1, a fault/event happened;

(2) The first scale of wavelet transform for the current traveling wave is identified as $I_{WT\_S1}$; this wavelet transform result equates the original signal passed through a bandpass filter with the frequency band of approximately [fs/2, fs/4], where fs is sampling frequency. For example, if the sampling frequency is 1 MHz, the first scale of wavelet transform comprises the frequency band of [250 kHz, 500 kHz];

(3) The first scale of wavelet transform for voltage traveling wave, identified as $U_{WT\_S1}$; this wavelet transform result equates the original signal passed through a bandpass filter with the frequency band of approximately [fs/2, fs/4], where fs is sampling frequency. For example, if the sampling frequency is 1 MHz, the first scale of wavelet transform comprises the frequency band of [250 kHz, 500 kHz];

(4) The fourth scale of wavelet transform for voltage traveling wave, identified as $I_{WT\_S4}$; this wavelet transform result equates the original signal passed through a bandpass filter with the frequency band of approximately [fs/32, fs/16], where fs is sampling frequency. For example, if sampling frequency is 1 MHz, the first scale of wavelet transform comprises the frequency band of [31.25 kHz, 62.5 kHz];

(5) The down-sampled of the rest after four scales wavelet transform of voltage traveling wave, identified as $U_{Scale\_4}$; this wavelet transform result equates the original signal passed through a low pass filter with the frequency band of approximately [−fs/32, fs/32], where fs is sampling frequency. For example, if sampling frequency is 1 MHz, the first scale of wavelet transform comprises the frequency band of [−31.25 kHz, 31.25 kHz];

(6) The down-sampled (of the rest, after four scales) wavelet transform of current traveling wave is identified as $I_{Scale\_4}$; this wavelet transform results equates to the original signal passed through a low pass filter with the frequency band of approximately [−fs/32, fs/32], where fs is sampling frequency. For example, if sampling frequency is 1 MHz, the first scale of wavelet transform comprises the frequency band of [−31.25 kHz, 31.25 kHz];

(7) The forward traveling wave of the down-sampled (of the remaining four scales) wavelet transform to voltage and current, identified as $F_{S4}$; that is, $F_{S4}=V_{Scale_4}+ ZC \cdot I_{Scale_4}$, where Zc represents the surge impedance. Zc can take an approximate value, such as set as 500 ohms in primary for an overhead transmission line, and set as 300 ohms for an underground cable. The signal $F_{S4}$ is also sent to the remote end, for traveling wave-based differential protection in the remote end.

(8) The backward traveling wave of the down-sampled (of the remaining four scales) wavelet transform to voltage and current, identified as $B_{S4}$; that is, $B_{S4}=V_{Scale_4}- Zc \cdot I_{Scale_4}$, where Zc represents the surge impedance. Zc can take an approximate value, such as set as 500 ohms in primary for an overhead transmission line, and set as 300 ohms for an underground cable.

(9) The digital signal of polarization of current traveling wave, identified as $D_{PI}$. $D_{PI}=0$ represents a failure to detect the polarization, or there was no fault; $D_{PI}=1$ represents positive polarization, and $D_{PI}=-1$ represents negative polarization. The signal of polarization also is sent to the remote end to formulate the polarization comparison protection in a remote end module.

Thus, as represented in FIG. 2, in one example implementation there are four components shown in the traveling wave real time analyzer 116, comprising the wavelet transform component 222, a fault detection component 224 (FtDt), a formulate F and B (forward and backward) component 226 and a polarization detection component 228.

The wavelet transform component 222 uses two sets of coefficients to perform the wavelet transform. One set of coefficients comprises the scale function coefficients, denoted as p(n), and the other set of coefficients comprises the wavelet coefficients, denoted as q(n). For example, the 3rd-order Daubechies wavelet can be used.

Figure 5:
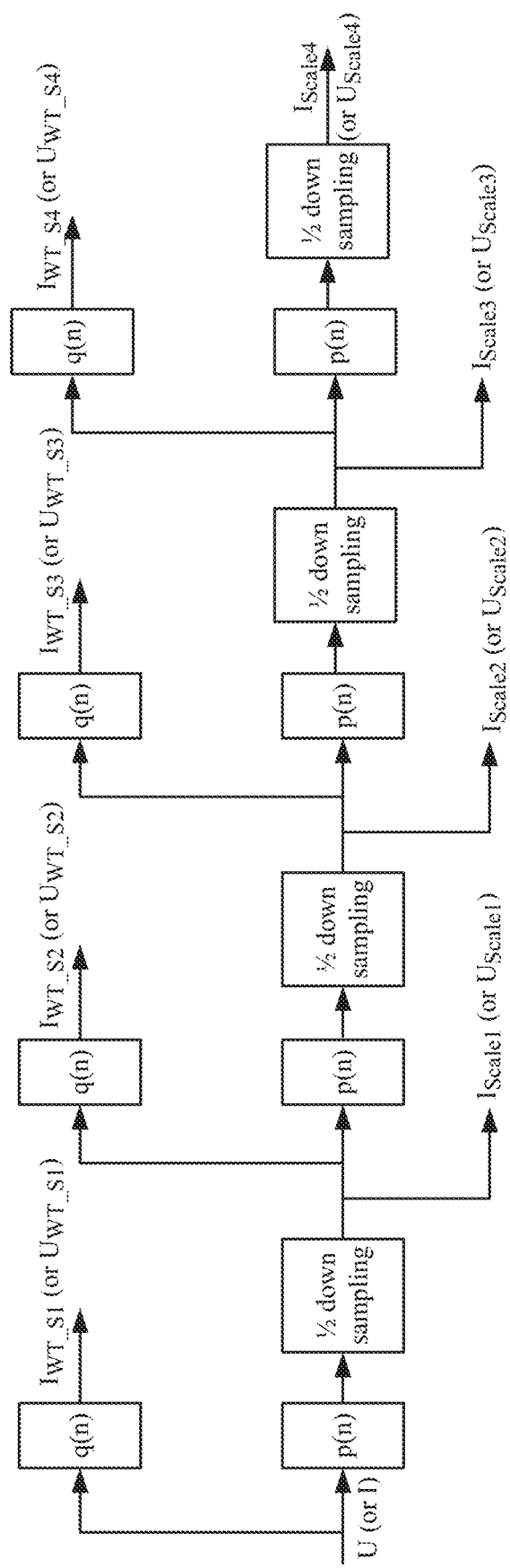
FIG. 5 is a block diagram representing various aspects of an example wavelet-transform, in accordance with one or more example implementations of the subject matter disclosed herein.

FIG. 5 shows details of the wavelet transform. In a first phase, the convolution of the input signal with coefficients p(n) and q(n) is obtained by using the following equations (using current as an example, as voltage operates the same way):

$$y_1(k) = \sum_{n=0}^{M-1} [I_\alpha(k-n) + jI_\beta(k-n)]p(n) \qquad (10)$$

$$I_{WT_{S_1}}(k) = \sum_{n=0}^{M-1} [I_\alpha(k-n) + jI_\beta(k-n)]q(n) \qquad (11)$$

A second phase performs down sampling the convolution of p(n) with half of the primary sampling rate, with the down sampling based on the following equation:

$$I_{Scale1}(k)=y_1 \qquad (12)$$

As shown in FIG. 5, the wavelet transform repeats to obtain the second scale of wavelet transform results $I_{WT_{S_2}}$ and second scale scaling transform results $I_{Scale2}$, similarly through $I_{WT_{S_3}}$ and $I_{Scale3}$ and $I_{WT_{S_4}}$ and $I_{Scale4}$.

Figure 6:
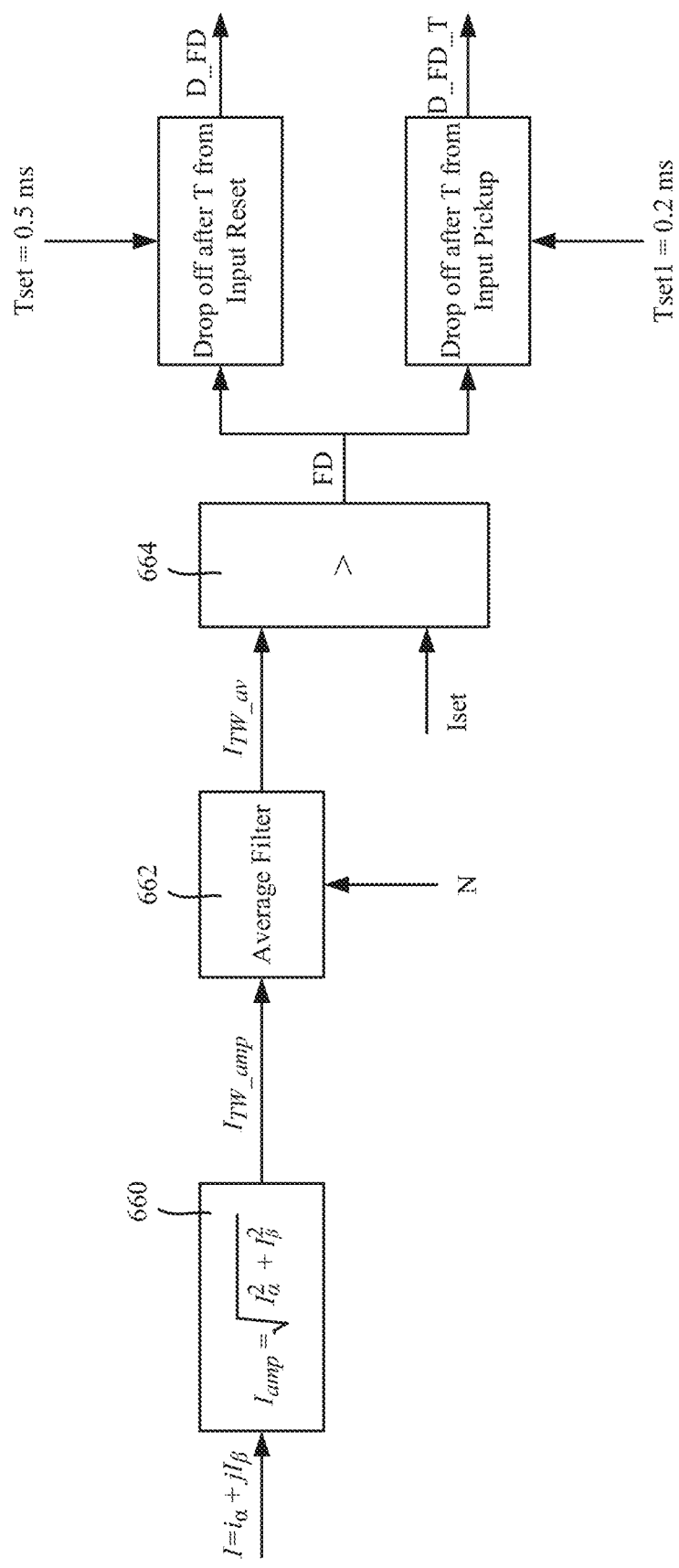
FIG. 6 is a block diagram representing various example aspects of a fault detection component, in accordance with one or more example implementations of the subject matter disclosed herein.

Example details of the fault detection component (FtDt) 224 are represented in FIG. 6, with the amplitude of the current vector represented by block 660 and calculated by the following equation:

$$I_{TW_{amp}}(n)=\sqrt{I_\alpha^2(n)+I_\beta^2(n)} \qquad (13)$$

An average filter 662 is applied to the amplitude; the window length of the average filter is N, for example, N can be set as 10 samples. An equation for the average filter 662 was previously shown in equation 9, as repeated below $$I_{TW_{av}}(n) = \frac{1}{N}I_{TW_{av}}(n) + \frac{N-1}{N}I_{TW_{amp}} \qquad (9)$$

A comparison is performed at block 664; when $I_{TW_{av}}$ is greater than $I_{set}$ (where $I_{set}$ can be selected as 0.05 per unit, for example), the fault detection value FD equals 1, else FD equals 0. If FD equals 1, D_FD equals 1; if FD equals 0, after delaying for a time $T_{set}$, where $T_{set}=0.5$ ms, D_FD equals 0 (the drop off delay). If FD equals 1, D_FD_T equals 1, after $T_{set}$ time from FD=1, D_FD_T=0.

Block 226 of FIG. 2 represents the formulation of forward and backward traveling wave, where the forward and backward traveling waves can be formulated by the following equations:

$$F_{S4}(n)=U_{Scale4}(n)+Z_C I_{Scale4}(n) \qquad (14a)$$

$$B_{S4}=U_{Scale4}(n)-Z_C I_{Scale4}(n) \qquad (14b)$$

where Zc represents the surge impedance of the line as described above; e.g., Zc can take an approximate value, such as set as 500 ohms in primary for an overhead transmission line, and set as 300 ohms for an underground cable.

Figure 7:
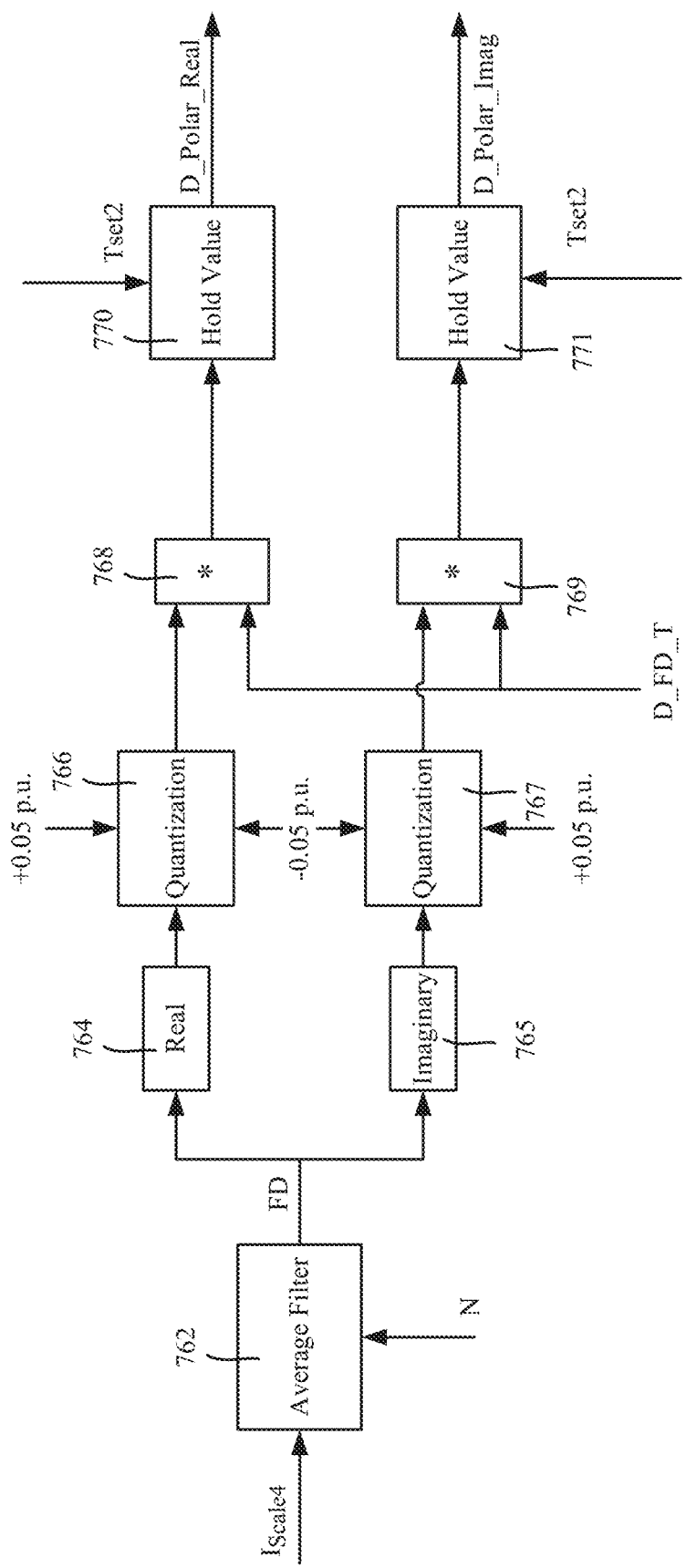
FIG. 7 is a block diagram representing an example polarization detection component, in accordance with one or more example implementations of the subject matter disclosed herein.

Additional details of the polarization detection component 228 (FIG. 2) are shown in FIG. 7. As can be seen, the $I_{scale4}$ passes through an average filter 762 with window length of N; the average filter 762 can be that shown in equation 9, and N also can be selected as ten samples.

The real part 764 and imaginary part 765 of the output of the average filter 762 passes through respective quantization filters 766 and 767; suitable thresholds of quantization for +1 and −1 are +0.05 p.u. (per unit) and −0.05 p.u. respectively. That is, if the value of (for example $I_{real}$) is greater than +0.05, the output of the quantization D_real=1; else if the value is less than −0.05, the output of the quantization D_real=−1; otherwise, if the value is within the range of −0.05 and 0.05, D_real=0.

As shown via blocks 768 and 769, the respective D_real and D_Imag values are multiplied by the D_FT_T (the signal from the fault detection unit 224, FIGS. 2 and 6). As represented by blocks 770 and 771, the respective results are held for time Tset2 (for example, 0.5 ms) to formulate the D_Polar_Real and D_Polar_Imag, where D_Polar_Real=1, if the value of real part of current is positive, D_Polar_real=−1, if the real part of current is negative, and if the value of real part is less than 0.05 and larger than −0.05, D_Polar_Real=0. The same applies for the imaginary portion, D_Polar_Imag.

Turning to traveling wave based protection, as seen in FIG. 2, the inputs to the traveling wave-based protection component 230 comprise (at least some of) the outputs of the traveling wave real time analyzer unit 116. The following protection functions can be formulated:

(1) Traveling-wave-based distance (block 232), in which the inputs are the first scale of wavelet transform of voltage and current traveling waves, and which can be formulated by comparing the time gap between the first and second effective wave with the propagation time from one end to another.

(2) Traveling-wave-based boundary protection (block 233), in which the inputs are the first scale and fourth scale of wavelet transform of the current traveling wave, and which can be formulated by comparing the magnitude of the first scale to the fourth scale.

(3) Traveling-wave-based direction (block 234), in which the inputs are the down-sampled value of the rest of fourth wavelet transform of forward and backward traveling wave, $F_{S4}$ and $B_{S4}$, and which can be formulated by comparing the magnitude of backward traveling wave and forward traveling wave.

(4) Traveling-wave-based direction-comparison (block 235), and which can be determined by comparing the fault directions made by traveling waves at both ends of the line.

(5) Traveling-wave-based differential protection (block 236) which can be formulated by comparing the differential wave, $W_{diff}$, and bias wave, $W_{bias}$, where the inputs are the backward traveling wave of local end and forward traveling wave of remote end.

(6) Traveling-wave-based polarization comparison protection (block 237) can be formulated by comparing the polarization of the current traveling wave of the two ends; if both the two ends are in same polarization, then it is determined to be an internal fault.

Figure 8:
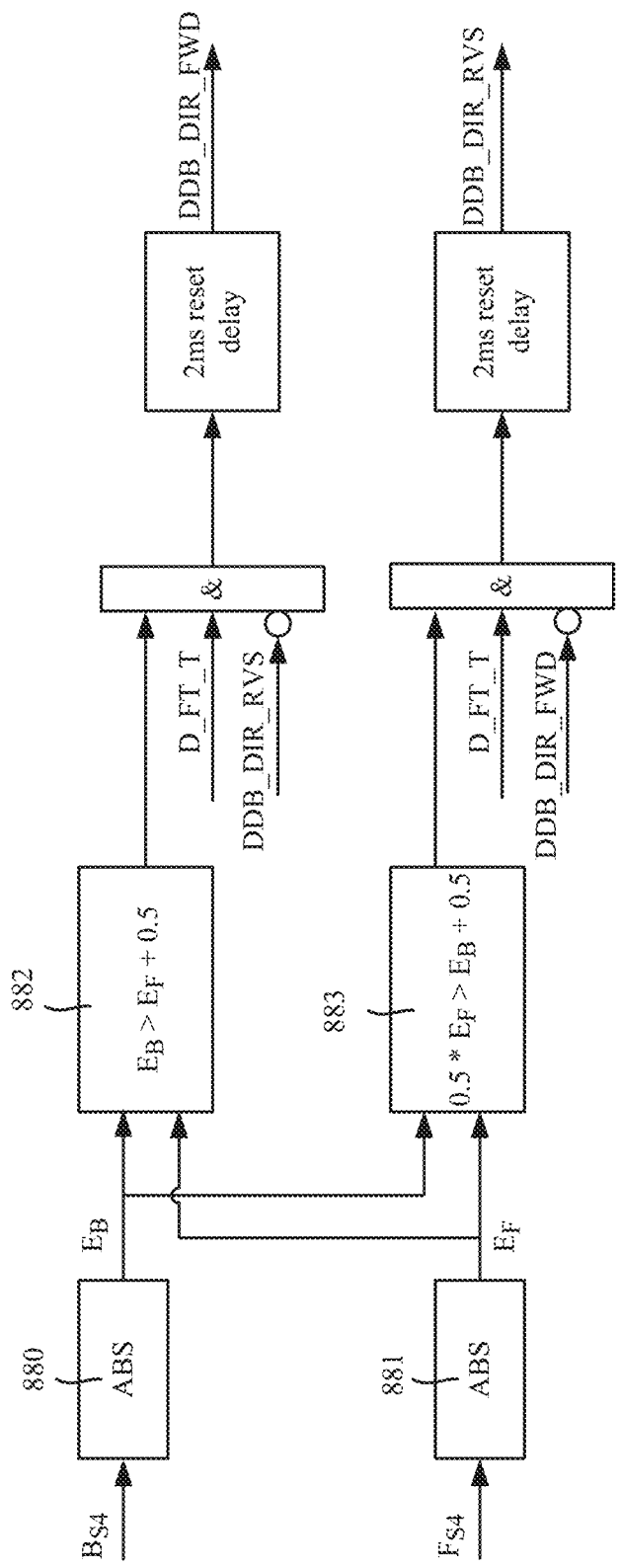
FIG. 8 is a representation of various example aspects of traveling-wave-based direction protection, in accordance with one or more example implementations of the subject matter disclosed herein.

FIG. 8 exemplifies details related to implementing the traveling wave-based direction protection (block 234, FIG. 2). In FIG. 8, the forward and backward traveling wave of the fourth scale from the output of wavelet transform (FIG. 2), $B_{S4}$ and $F_{S4}$, are sent to respective absolute operator elements 880 and 881, where the absolute (ABS element) values of $B_{S4}$ and $F_{S4}$ can be obtained by the following equation:

$$\begin{cases} E_B = \sqrt{[\text{real}(B_{S4})]^2 + [\text{imag}(B_{S4})]^2} \\ E_F = \sqrt{[\text{real}(F_{S4})]^2 + [\text{imag}(F_{S4})]^2} \end{cases} \quad (15)$$

As shown via blocks 882 and 883, $B_{S4}$ and $F_{S4}$ are used as a basis for comparison, with the results used as shown in FIG. 8. Note that D_FT_T is the fault detection signal from fault detection unit, as shown in FIGS. 2 and 6. The reset delay provides that if the input picks up, the output picks up; whereas if the inputs drop off, the output will drop off, delaying for a period of time after input drops off. An output of DDB_DIR_FWD (that picks up) means that the fault is a forward directional fault, and the output DDB_DIR_RVS (that picks up) means that the fault is a reverse directional fault.

Figure 9:
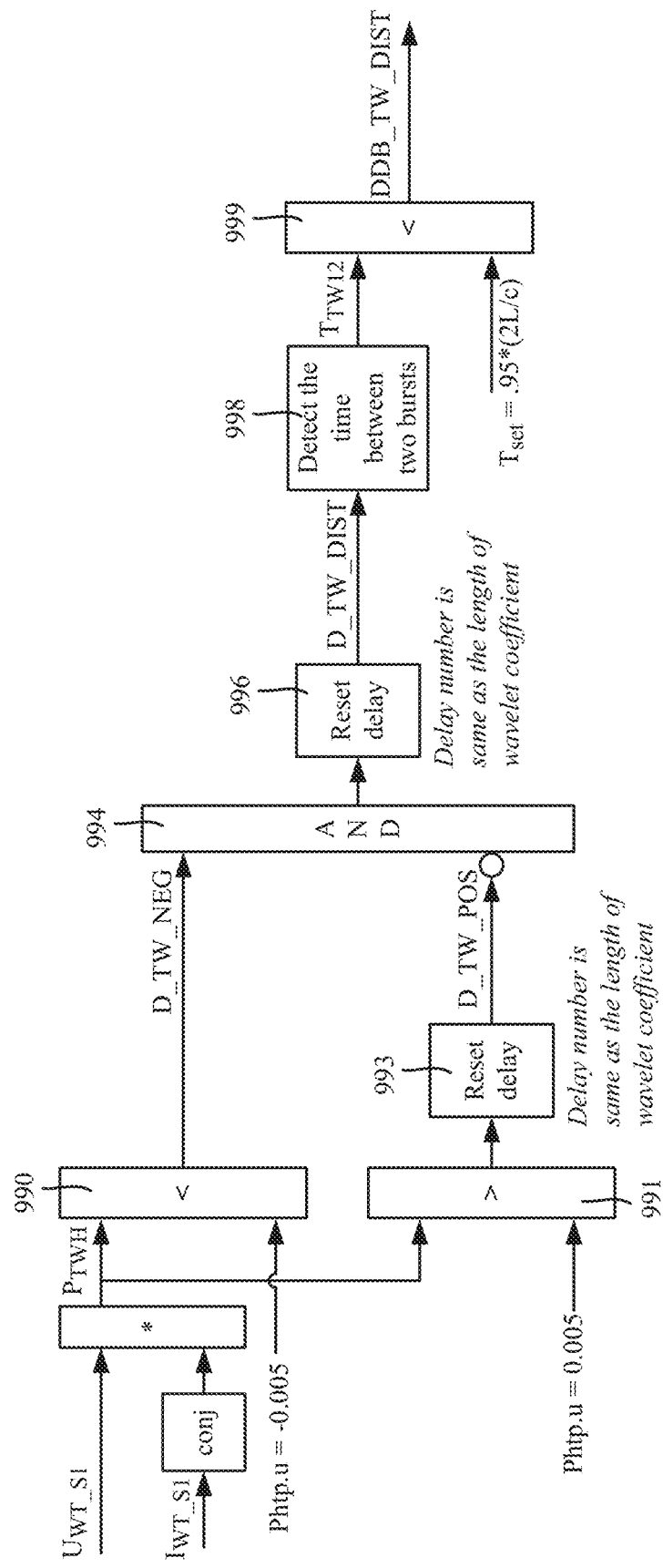
FIG. 9 is a representation of various example aspects related to traveling-wave-based distance protection, in accordance with one or more example implementations of the subject matter disclosed herein.

An implementation in the form of a schematic diagram for f traveling wave-based distance protection (block 232, FIG. 2) is depicted in FIG. 9. In FIG. 9, the power of the high frequency traveling waves $P_{TWH}$ is calculated by the first scale of the results of the wavelet transform for voltage and current $U_{WT\_S1}$ and $I_{WT\_S1}$. In a first operation (block 990), if $P_{TWH}$ is less than −0.005 p.u., D_TW_NEG=1, else D_TW_NEG=0. In a second operation (block 991), if $P_{TWH}$ is larger than 0.005 p.u., including a reset delay (block 993) taken for the length of h (length of coefficients of wavelet), then D_TW_POS=1, else D_TW_POS=0.

As shown via blocks 994 (AND) and 996 (reset delay), D_TW_DIST is the result of an AND operation on D_TW_NEG and NOT D_TW_POS, that is, if D_TW_NEG=1, and D_TW_POS=0, D_TW_DIST=1, else, D_TW_DIST=0. The bursts of D_TW_DIST is used for traveling wave time interval detection, for traveling wave-based distance protection.

Block 998 measures the time, $T_{TW12}$, between the first two bursts of D_TW_DIST. Block 999 discriminates the internal fault for traveling wave-based distance protection. If $T_{TW12}$<Tset, then it is determined as an internal fault, and DDB_TW_DIST is issued. Tset is set as 0.95*(2 L/c), where L is the length of the protected line, c is the speed of the traveling wave, which is approximately 2.97 e+5 km/s for overhead transmission line; whereas for cable the speed is calculated by the following equation:

$$c = \sqrt{\frac{1}{L_1 C_1}} \quad (16)$$

where $L_1$ is positive sequence inductance per unit length, $C_1$ is positive sequence shunt capacitance per unit length of cable. This can be corrected online by the charging of the line.

With respect to traveling wave-based boundary protection (block 233, FIG. 2), The inputs to the boundary protection unit are the first scale and fourth scale wavelet transform of current traveling wave respectively, that is, $I_{WT\_S1}$ and $I_{WT\_S4}$. A scheme for implementing the traveling wave-based boundary protection is represented in FIG. 10.

Figure 10:
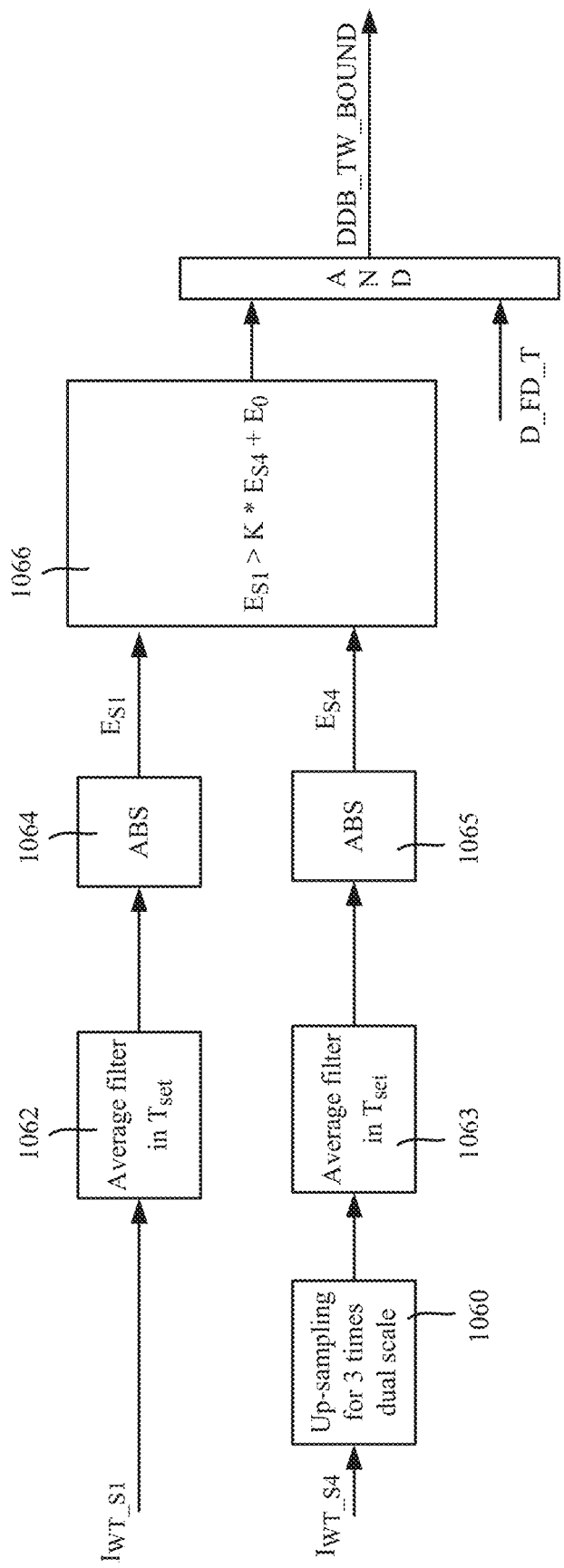
FIG. 10 is a representation of various example aspects related to traveling-wave-based boundary protection, in accordance with one or more example implementations of the subject matter disclosed herein.

In FIG. 10, the first scale wavelet transform of current $I_{WT\_S1}$ goes into an average filter 1062 in a time window of Tset; such a filter can be same as the filter in the fault detection unit (equation 9), with the time window N equaling Tset/Ts. Note that Tset can be selected as 0.2 ms for example, and Ts is the sampling period, such as 1 μs for 1 MHz sampling rates. The absolute value $E_{S1}$ (block 1064) can be calculated by equation 15, where the absolute value is the square root of the summation between the square of real part and the square of imaginary part.

As also shown in FIG. 10, the fourth scale wavelet transform of current IWT_S4 is dual-step-resolution up-sampled three times (block 1060) to make the fourth scale value the same resolution as the first scale value. The up-sampling can be made by two steps; a first step inserts zeros between samples, and second step is a convolution operation with coefficient p(n), as in FIG. 5 for the wavelet transform. Again, the absolute value $E_{S4}$ (block 1065) can be calculated using the same technique used in calculating $E_{S1}$.

As represented via block 1066, if $E_{S1}$>K*$E_{S4}$+$E_0$, where K can be selected as 0.25 for example, and $E_0$ can be selected as 0.01 p.u., then the fault is discriminated as an internal fault, and the DDB_TW_BOUND output is high (value one). This output is AND'ed with D-FD_T (obtained via FIG. 6) to provide a resultant DDB_TW_BOUND value.

Figure 11:
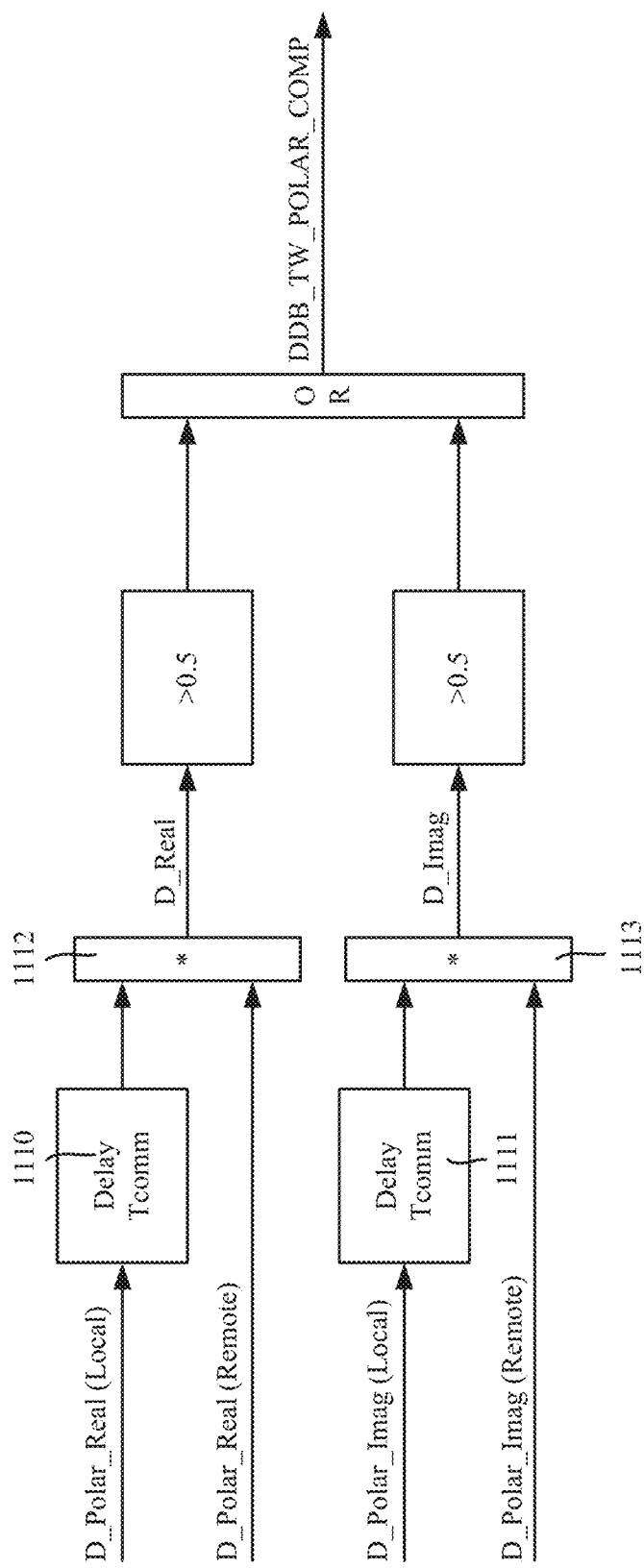
FIG. 11 is a representation of various example aspects related to traveling-wave-based polarization comparison protection, in accordance with one or more example implementations of the subject matter disclosed herein.

A scheme for implementing the traveling-wave-based polarization comparison protection (block 237, FIG. 2) is shown in FIG. 11. The inputs to the traveling wave-based polarization comparison protection component 237 comprise the polarization signal (real and imaginary) from both local and remote terminals. The local signal of polarization needs to be delayed (blocks 1110 and 1111) with the communication time latency and multiplied (blocks 1112 and 1113) by the polarization signal of the remote end. If the result of the multiplication is positive, this indicates that the polarization of the two terminals are the same; (positive polarization the signal will be +1, negative polarization the signal will be −1).

Figure 12:
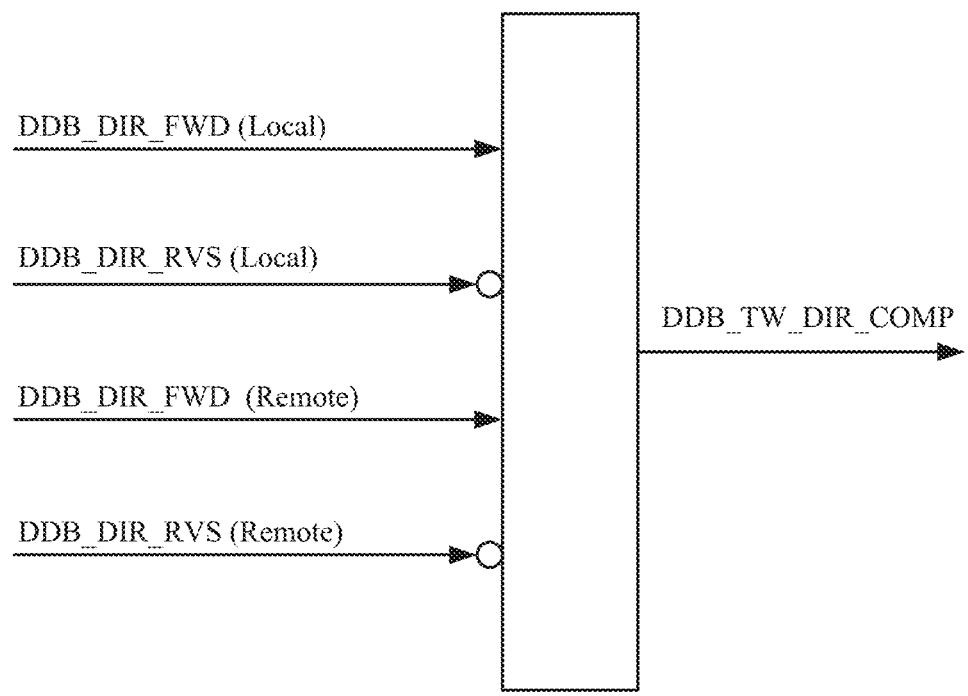
FIG. 12 is a representation of various example aspects related to traveling-wave-based direction comparison protection, in accordance with one or more example implementations of the subject matter disclosed herein.

A scheme for traveling wave-based direction comparison protection (block 234, FIG. 2) is represented in FIG. 12. As can be seen, if the direction determinations of fault from both local terminal and remote terminal are in the forward direction, then it is an internal fault, and DDB_TW_DIR_COMP=1.

Figure 13:
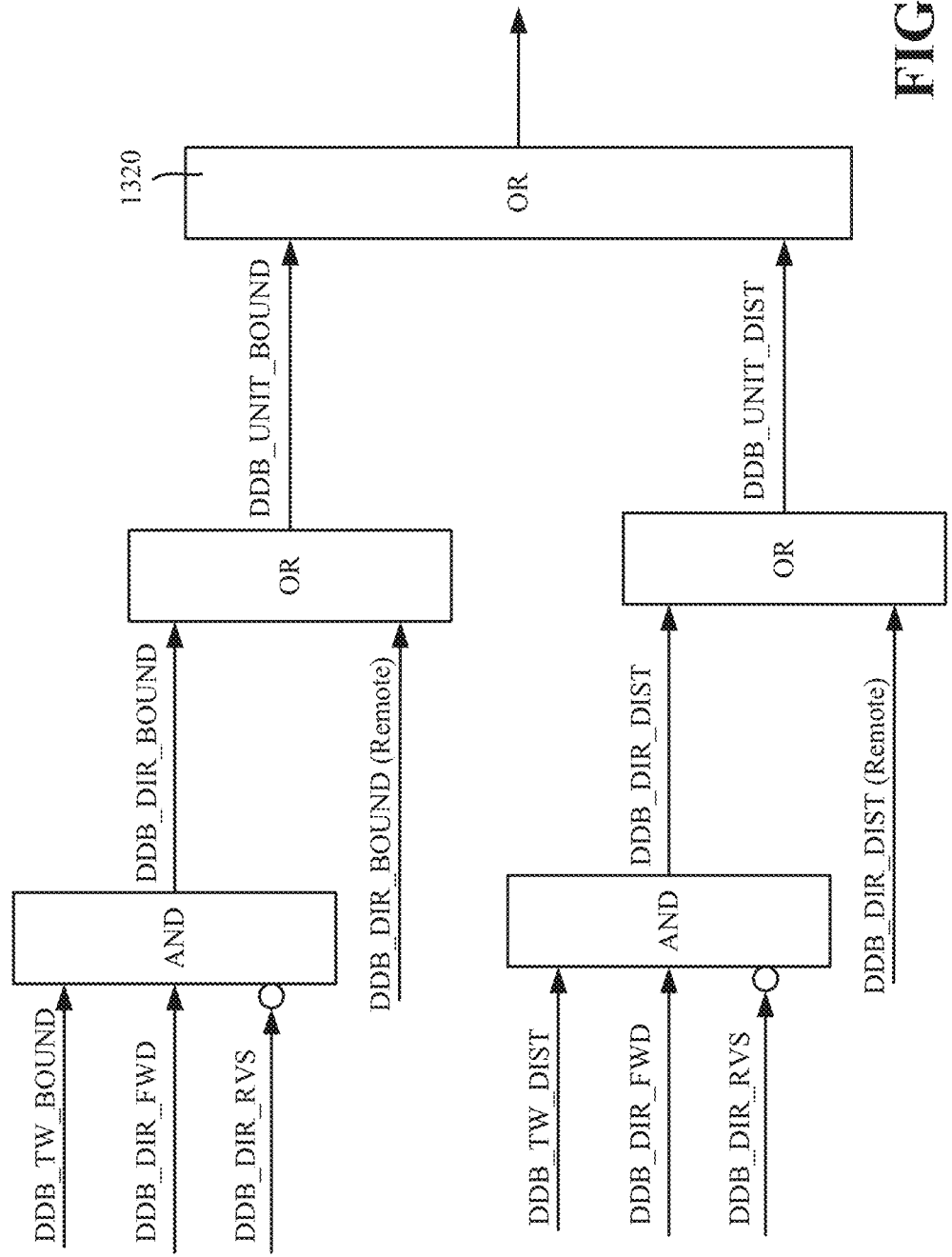
FIG. 13 is a representation of various example aspects related to traveling-wave-based directional distance/boundary unit protection, in accordance with one or more example implementations of the subject matter disclosed herein.

FIG. 13 shows a scheme for traveling-wave-based directional distance/boundary unit protection. The output of the traveling wave-based boundary protection (using boundary protection as an example) or the distance protection can be supervised by a directional signal from the direction element to formulate a directional boundary protection (DDB_DIR_BOUND) or directional distance protection (DDB_DIR_DIST). When combined with the direction boundary/distance signal, this formulates a unit boundary/distance protection scheme by using an OR gate 1320.

Figure 14:
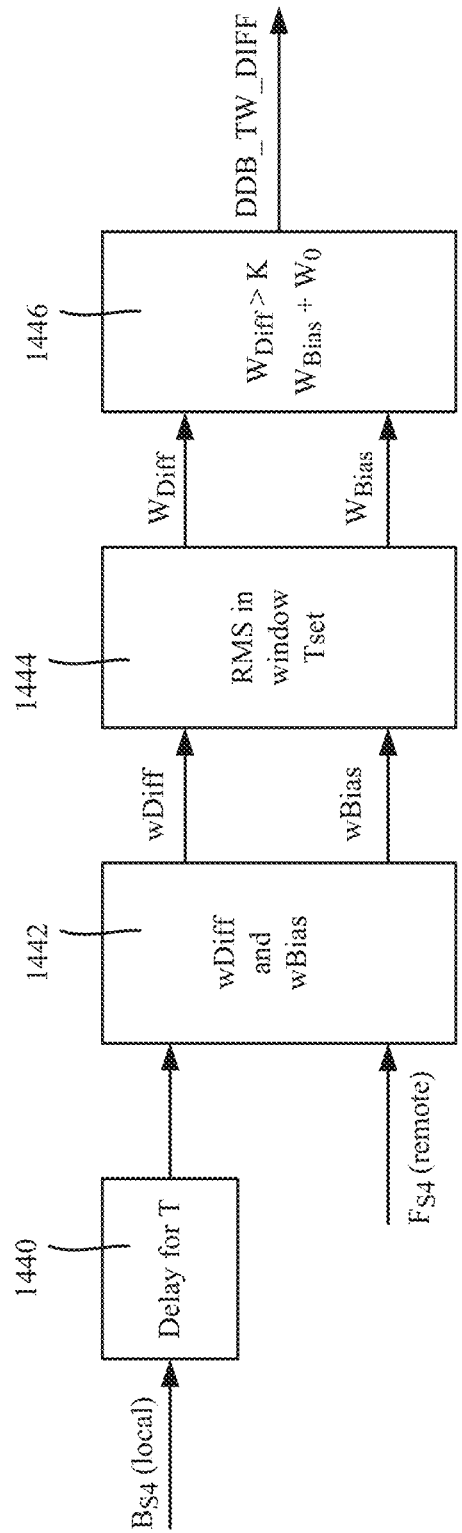
FIG. 14 is a representation of various example aspects related to traveling-wave-based differential protection, in accordance with one or more example implementations of the subject matter disclosed herein.

FIG. 14 shows a scheme for traveling wave based differential protection (block 236, FIG. 2). The inputs to the traveling wave-based differential protection comprise the 4th scale scaling transform of the backward traveling wave $B_{S4}$ as described above and the 4th scale scaling transform of the forward traveling wave from the remote end.

A first step represented by block 1440 aligns the local traveling wave $B_{S4}$ with the received traveling wave $F_{S4}$ by delaying the local wave for T:

$$T = T_{comm} - T_{prop} \qquad (17)$$

where $T_{comm}$ is the communication latency of sending wave data from the remote terminal; this time can be addressed by the time tags on the samples (synchronization devices, such as GPS, can be used) and $T_{prop}$ is the propagation time of traveling wave from remote terminal to local terminal, which can be calculated by:

$$T_{prop} = \frac{L}{c} \qquad (18)$$

where, L is the line length and c is the speed of the traveling wave, which, for example can be set as 2.97 e5 km/s, or calculated by equation 16. This time can also be commissioned when the line is charging.

A second step represented by block 1442 relates to the differential traveling wave and a bias traveling wave. The differential traveling wave, $w_{Diff}$, and bias traveling wave, $w_{Bias}$, can be obtained from the following equations:

$$\begin{cases} w_{Diff}(n) = [B_{S4_{Local}}(n) - F_{S4_{remote}}(n-N)]/Z_C \\ w_{Bias}(n) = [B_{S4_{Local}}(n) + F_{S4_{remote}}(n-N)]/(2Z_C) \end{cases} \qquad (19)$$

where N equals round(T/Ts) and Zc is the surge impedance; for an overhead line Zc can equal 500 Ohms in the primary side, while for cables, $Z_C$ can be calculated by $Z_C$=sqrt($L_1$/$C_1$).

In a third step represented by block 1444, the RMS value in the time window (Tset=0.2 ms) can be calculated by the following equation:

$$X_{RMS}(n) = \sqrt{\frac{1}{N}\sum_{k=1}^{N}|x(n-N+k)|^2} \qquad (20)$$

where N=round(Tset/Ts).

A fourth step represented by block 1446 provides for the discrimination of the internal and external fault, that is, whether $W_{diff}$ is greater than K times $W_{bias}$ plus $W_0$, where $W_0$ can, for example, equal 0.1, and K can be settable as 0.1-1.

Note that the final tripping logic needs to combine with the signal obtained via faulty phase identification 114 (FIGS. 1-4).

Turning to aspects related to fault location, a fault detection signal is produced by the traveling wave analyzer 116 (FIGS. 1 and 2) for freezing the traveling wave samples in memory 110 for the purpose of highly accurate offline fault location based on the traveling waves. More particularly, once the fault is detected, the memory comprising the traveling wave samples provides a snapshot of these persisted samples, which are sent to a fault location module, a central unit and/or a third party server to perform fault location operations. As shown in FIG. 1, a fault locator 125 can comprise a single-ended fault location 126, double-ended fault location 127 and/or multi-ended fault location 128. The outputs from the fault locator 125 (e.g., any of 125-127) can comprise the fault section and fault distance.

Figure 15:
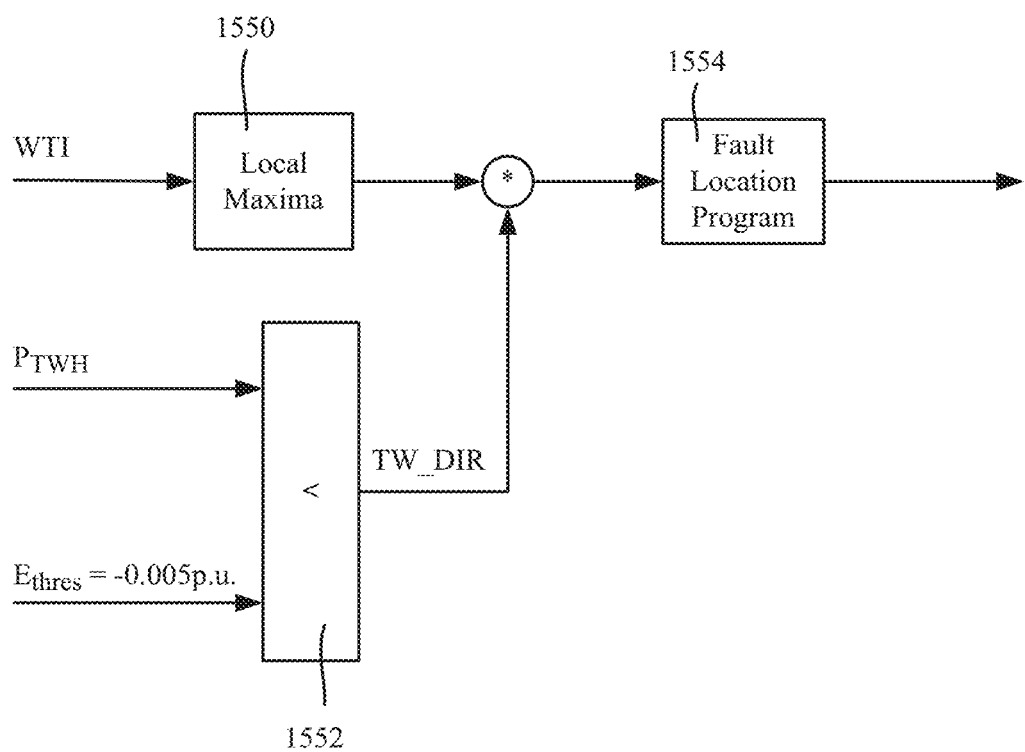
FIG. 15 is a representation of various example aspects related to a traveling-wave-based single-ended fault locator, in accordance with one or more example implementations of the subject matter disclosed herein.

For single-ended fault location, the wavelet-transform of current, $I_{WT\_S1}$, and the active power of high frequency traveling wave $P_{TWH}$ are fed into the single-ended fault locator 126. FIG. 15 shows a scheme for a traveling wave-based single-ended fault locator.

In FIG. 15, block 1550 finds the local maxima of the absolute value (modulus) of $I_{WT\_S1}$. Block 1552 detects the direction of the local maxima. If $P_{TWH}$ is less than a minus threshold, e.g. −0.005, then the maxima is kept, otherwise it is discarded. The local maxima value(s) with forward direction is sent to a fault location program 1554 to calculate the fault distance.

Figure 16:
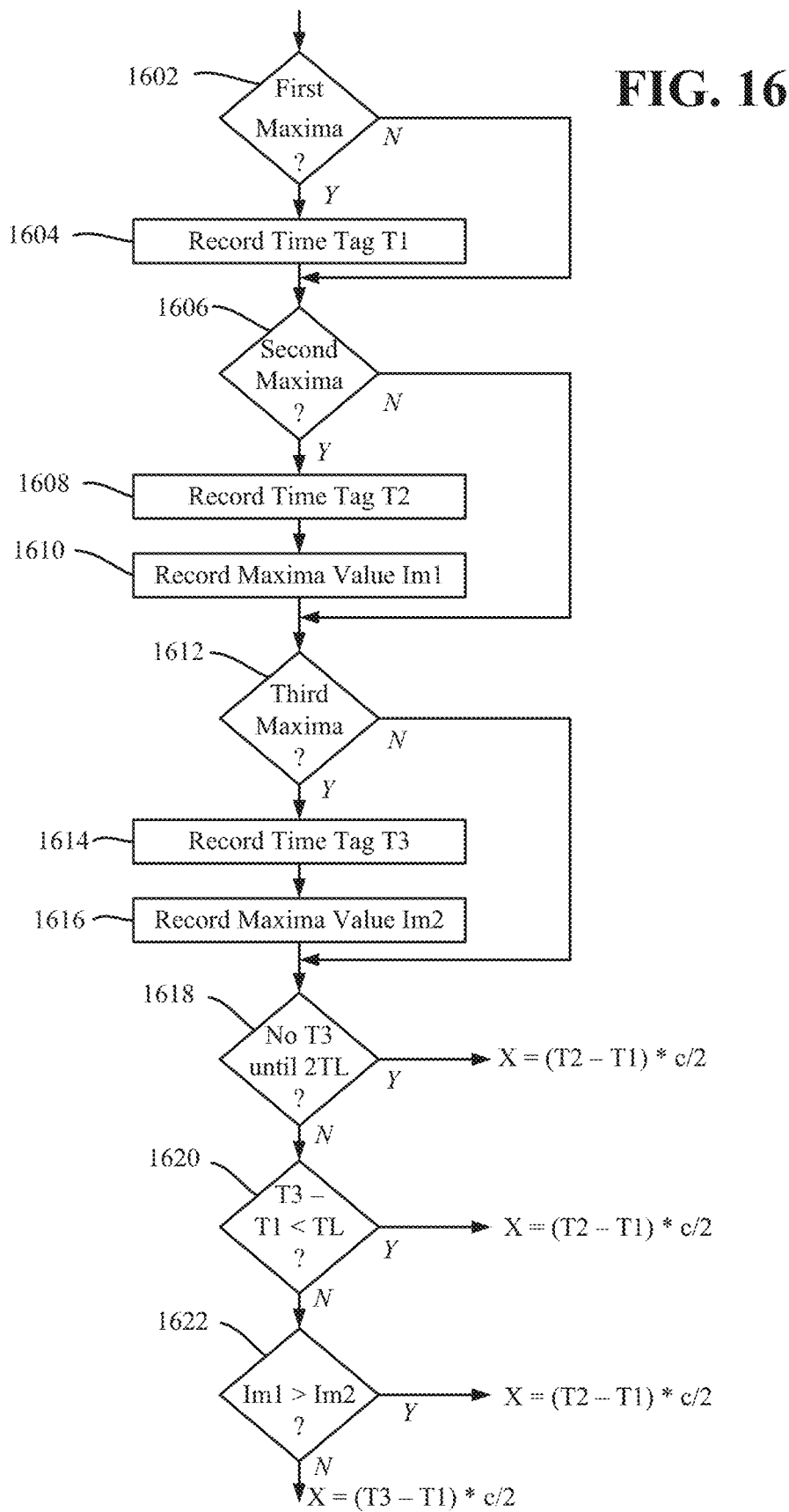
FIG. 16 is a flow diagram representation of various example operations related to traveling-wave-based single-ended fault location, in accordance with one or more example implementations of the subject matter disclosed herein.

The fault location program logic 1554 is presented in FIG. 16. As can be seen, operation 1602 evaluates for a first maxima, and if it exists, operation 1604 records the time tag T1. Similarly, operation 1606 evaluates for a second maxima, and if it exists, operation 1608 records the time tag T2; further, operation 1610 records the maxima value as Im1. Operation 1612 evaluates for a third maxima, and if it exists, operation 1614 records the time tag T3 and operation 1616 records the maxima value as Im2.

With the values obtained via operations 1604, operations 1608 and 1610 and/or operations 1614 and 1616, the logic shown via operations 1618, 1620 or 1622 produce X, the distance based on T1 and T2 or T3. Note that c is the speed of the traveling wave.

Figure 17:
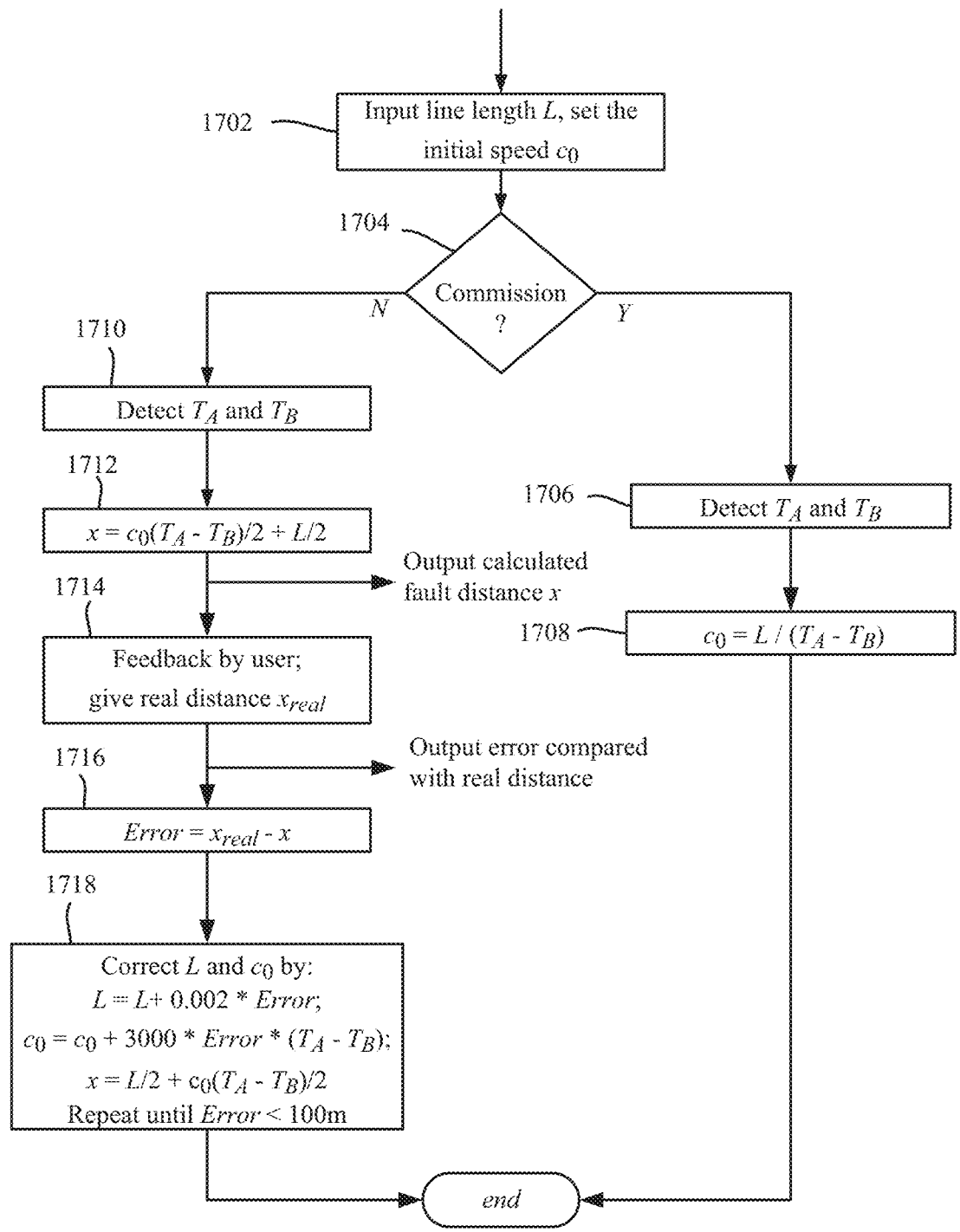
FIG. 17 is a flow diagram representation of various example operations related to traveling-wave-based double-ended fault location, in accordance with one or more example implementations of the subject matter disclosed herein.

For double-ended fault location, the recorded samples or the detected arriving time is sent to a central unit. The fault locator, such as the double-ended fault locator component 127 (FIG. 1) can be deployed in the central unit. A process for accurately locating a fault is shown in FIG. 17.

Operation 1702 of FIG. 7 inputs the initial parameters of line length L and traveling wave speed $c_0$; this speed can either be evaluated by line parameters of series impedance and shunt admittance, or given by an approximate value, such as 2.95 E+5 km/s for an overhead transmission line.

$$c_0 = \frac{2\pi f_0}{\text{imag}(\sqrt{z_1 y_1})} \qquad (21)$$

where $z_1$ is the series impedance per kilometer line, $y_1$ is the shunt admittance per kilometer line and $f_0$=50 or 60 Hz.

If the line is charging as evaluated by operation 1704, that is, only one terminal breaker is closed, then the speed of traveling wave can be modified by detection (operation 1706) of the arriving time at two terminals (operation 1708):

$$c_0 = \frac{L}{T_A - T_B} \quad (32)$$

where TA is the time that traveling wave arrived at remote terminal (where the breaker is not closed), TB is the arriving time at the terminal where the breaker is closed.

If there is a fault occurring on the line, in substation A, the traveling wave arriving time is detected at operation 1708 as TA, and in substation B, the traveling wave arriving time is TB. The fault distance to substation A can be determined by operation 1712, corresponding to the following equation:

$$x = \frac{c_0(T_A - T_B) + L}{2} \quad (23)$$

After the fault location is found, if possible repair personnel or the like can be asked to input the feedback (operation 1714) of the real fault distance for correcting the parameters of L and c0, subsequently improving the accuracy of fault location. The parameters can be corrected by the following formula (operations 1716 and 1718):

Error=$x_{real}$-$x$ $L = L + 0.002*$Error $c_0 = c_0 + 3000*$Error$*(T_A - T_B)$ The fault distance can be calculated again, repeating the operations 1716 and 1718 as needed, e.g., until the error is less than 150 meters. The corrected parameters of L and $c_0$ are recorded for the next time fault location.

FIG. 18 shows a multi-ended system, for which multi-ended fault location (block 128, FIG. 1) can be performed. Consider for example that a fault occurs on an multi ended system, where the traveling wave devices/nodes TWD_A-TWD_H are deployed on each junction.

Figure 19:
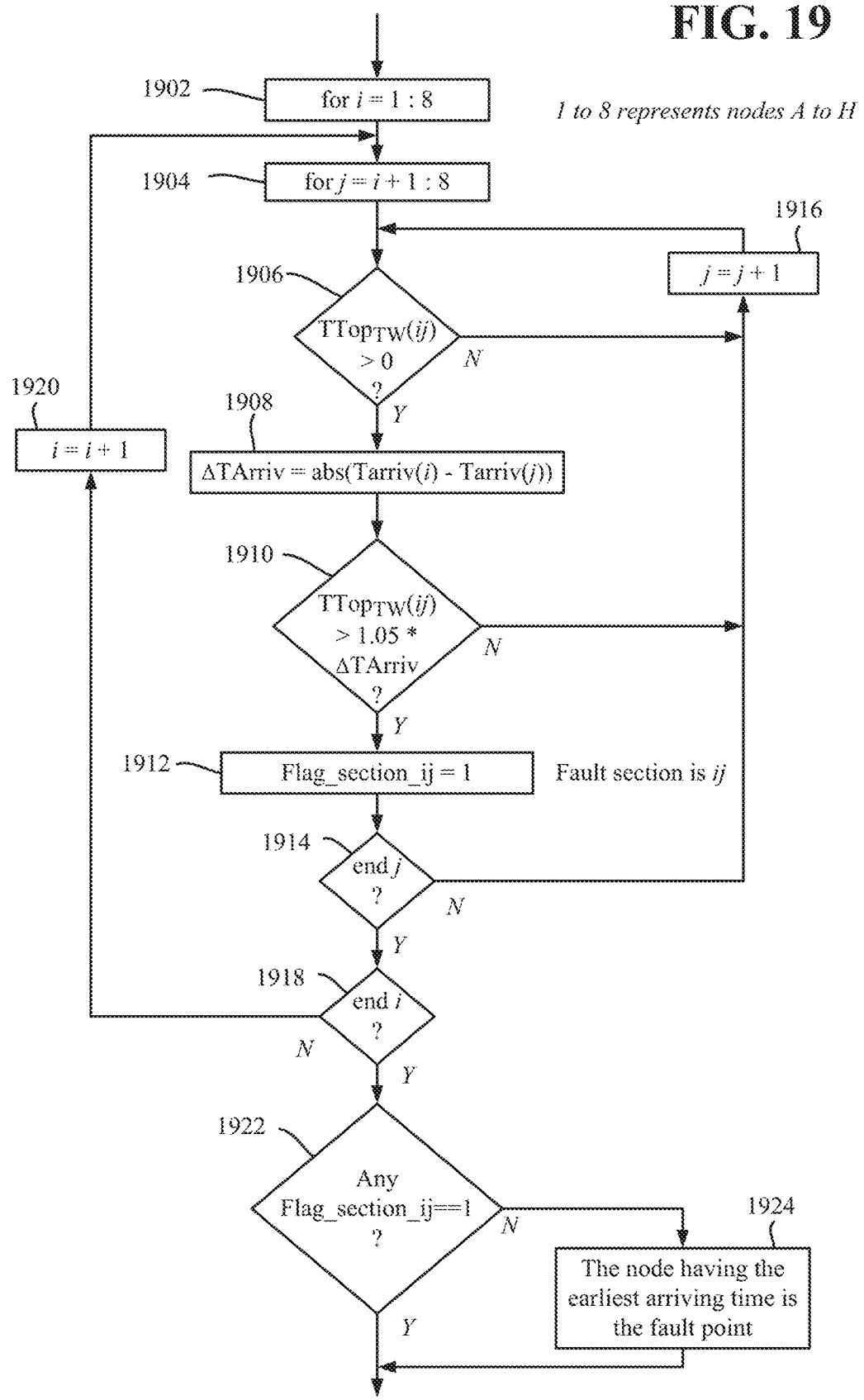
FIG. 19 is a flow diagram representation of various example operations related to locating a fault section by the arriving times of traveling waves in a multi-ended system, in accordance with one or more example implementations of the subject matter disclosed herein.

A process for fault location and fault section identification (locating a fault section) for the above example (for nodes A-H corresponding to 1 to 8) is shown in FIG. 19. Before the fault section location occurs, a traveling wave topology matrix is formulated by the following sub-process: if node i (i=A,B, . . . ,H) is directly connected with node j (j=A, B, . . . ,H), then i-th row, j-th column of the matrix is the $T_{Lij}$, which is the propagation time from node i to j:

$$T_{Lij} = \frac{L_{ij}}{c_{ij}},$$

where, $L_{ij}$ is the section length between i and j, $c_{ij}$ is the traveling wave speed traveling in this section (it may be different from the speed in a different section, because the conductor could be different). If the node i is not directly connected with node j, then the i-th row, j-th column of the matrix is zero:

$$TTop_{TW} = \begin{bmatrix} & A & B & C & D & E & F & G & H \\ A & 0 & T_{LAB} & 0 & 0 & 0 & 0 & 0 & 0 \\ B & T_{LAB} & 0 & T_{LBC} & T_{LBD} & 0 & 0 & 0 & 0 \\ C & 0 & T_{LBC} & 0 & 0 & 0 & 0 & T_{LCG} & T_{LCH} \\ D & 0 & T_{LBD} & 0 & 0 & T_{LDE} & T_{LDF} & 0 & 0 \\ E & 0 & 0 & 0 & T_{LDE} & 0 & 0 & 0 & 0 \\ F & 0 & 0 & 0 & T_{LDF} & 0 & 0 & 0 & 0 \\ G & 0 & 0 & T_{LCG} & 0 & 0 & 0 & 0 & 0 \\ H & 0 & 0 & T_{LCH} & 0 & 0 & 0 & 0 & 0 \end{bmatrix}$$

Operations 1902-1918 measure the traveling wave at each junction point (if it is a current measurement, the current of any one of the branches connected with the junction can be measured at this junction, thereby not necessarily deploying current measurements for each branch that is connected with the junction). By iterating through i and j corresponding to the nodes A-H in this example, the primary arriving time of traveling waves is determined. For example, if a fault happens in section BD, each traveling wave device (TWD) can measure the traveling wave and obtain an arriving time of the primary traveling wave, TArriv_A, TArriv_B, TArrivC, . . . , TArrivH.

Operations 1922 and 1924 (if needed) locate the fault section. In general, at operation 1922 if the arriving time difference is less than the propagation time along a given section, then the fault is in that section. If the fault is not in any of the sections, that is, there is no section for which the arriving time difference is less than propagation time along this section, then the fault is on the node at which the arriving time is the earliest (operation 1924). As long as the fault section is determined, the fault distance can be determined by the double ended method, which has been presented above.

Figure 20:
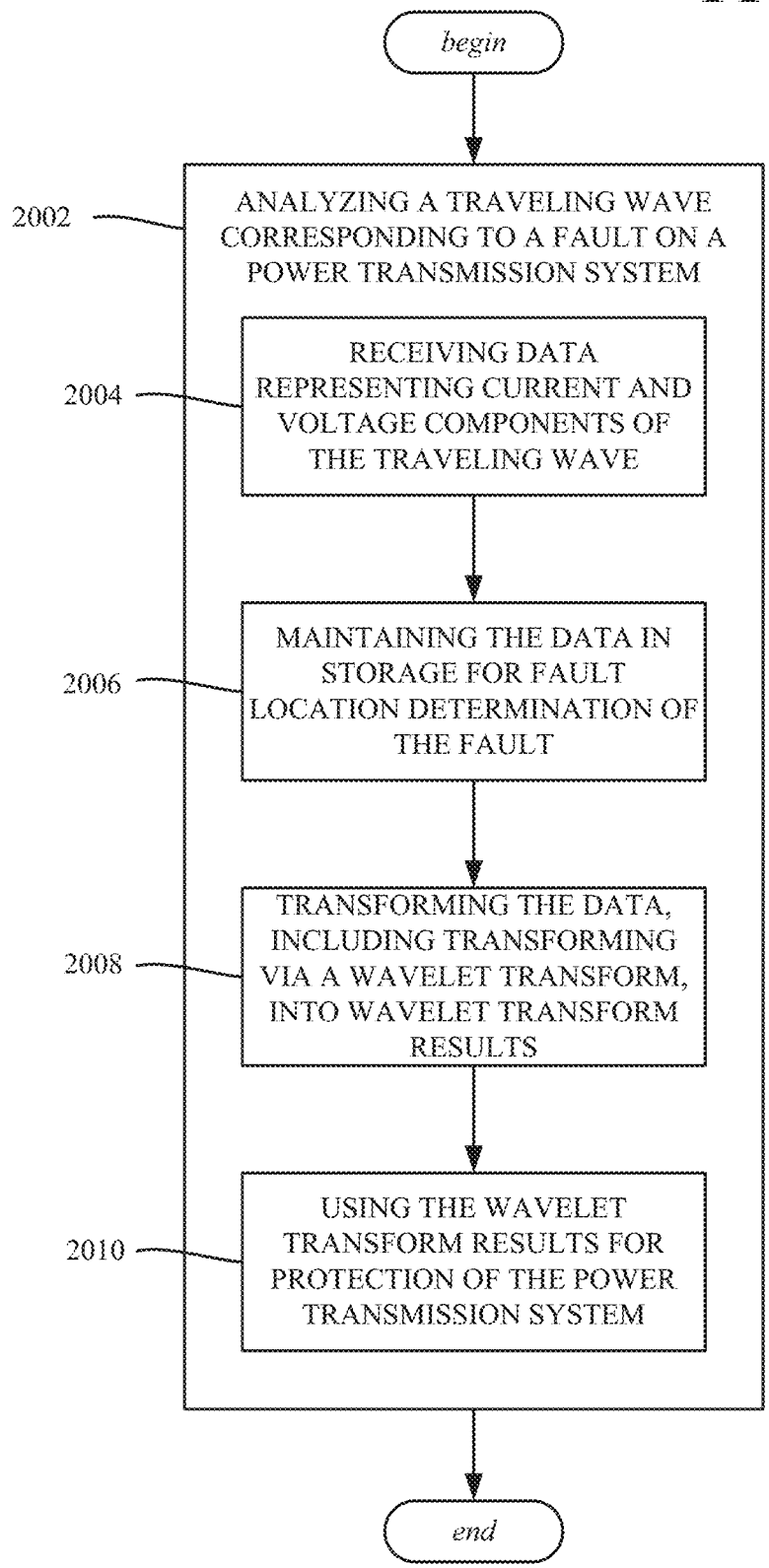
FIG. 20 is a flow diagram representation of various aspects related to analyzing a traveling wave for power transmission system protection and fault location, in accordance with one or more example implementations of the subject matter disclosed herein.

One or more aspects, such as those implemented in example operations (e.g., performed by a system comprising a processor) of a method, are represented in FIG. 20, and are directed towards analyzing (operation 2002) a traveling wave corresponding to a fault on a power transmission system. Operation 2004 represents receiving data representing current and voltage components of the traveling wave. Operation 2006 represents maintaining the data in storage for fault location determination of the fault. Operation 2008 represents transforming the data, including transforming via a wavelet transform, into wavelet transform results. Operation 2010 represents using the wavelet transform results for protection of the power transmission system.

Aspects can comprise receiving analog current and voltage information from respective current and voltage sensors coupled to the power transmission system, filtering the analog current and voltage information via bandpass filtering to obtain traveling wave information comprising analog current and voltage information, and digitizing the traveling wave information into the data representing the current and voltage components of the traveling wave.

Transforming the data, including transforming via the wavelet transform, can comprise transforming the data via an α-β transform into spatial vectors comprising a current vector and a voltage vector, and performing the wavelet transform on the current vector and the voltage vector into the wavelet transform results.

Using the wavelet transform results for the protection of the power transmission system can comprise using a first scale of the wavelet transform results of voltage and current traveling waves for traveling wave-based distance protection. Using the wavelet transform results for the protection of the power transmission system can comprise using a first scale of and a fourth scale of the wavelet transform results of current traveling waves for traveling wave-based boundary protection. Using the wavelet transform results for the protection of the power transmission system can comprise using down-sampled values corresponding to forward and backward traveling waves to determine traveling wave direction data. Using the wavelet transform results for the protection of the power transmission system can comprise using the traveling wave direction data for direction-comparison-based protection that compares the fault directions made by traveling waves at ends of the power transmission system.

Using the wavelet transform results for the protection of the power transmission system can comprise formulating forward and backward traveling wave information based on a fourth scale of the wavelet transform results of voltage traveling waves and a fourth scale of the wavelet transform results of current traveling waves multiplied by a system surge impedance value, using the forward and backward traveling wave information to obtain differential traveling wave information and bias traveling wave information, and using the differential traveling wave information and the bias traveling wave information for traveling wave-based differential protection.

Using the wavelet transform results for the protection of the power transmission system can comprise comparing polarization of the current traveling wave at two ends of the power transmission system to perform polarization comparison protection. Using the wavelet transform results for the protection of the power transmission system can comprise performing unit protection to output a tripping signal within a defined boundary. Using the wavelet transform results for the protection of the power transmission system can comprise performing non-unit protection to output a tripping signal.

Maintaining the data in the storage for the fault location determination can comprise providing time-based snapshot data to a single-ended traveling wave fault locator.

Maintaining the data in the storage for the fault location determination can comprise providing time-based snapshot data to a double-ended traveling wave fault locator. Aspects can comprise comprising, obtaining a real fault distance value, and using the real fault distance value to improve fault location accuracy.

Maintaining the data in the storage for the fault location determination can comprise providing time-based snapshot data to a multi-ended traveling wave fault locator. Aspects can comprise iterating, by the multi-ended traveling wave fault locator, over a group of junction points corresponding to traveling wave devices deployed at multiple ends to locate a fault section.

Figure 21:
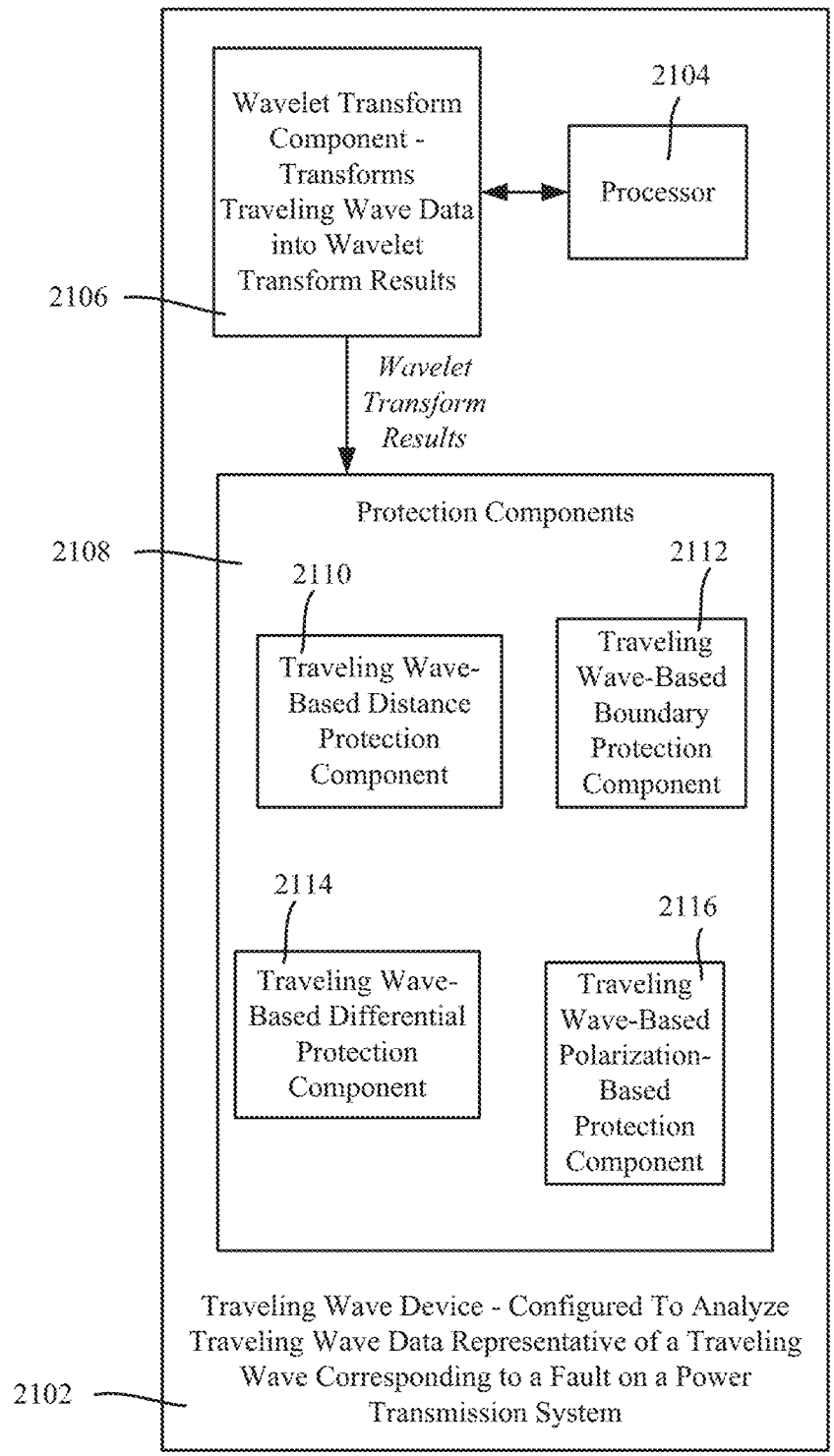
FIG. 21 is a block diagram representation of various components related to using traveling wave wavelets, transformed from a traveling wave, for power transmission system protection, in accordance with one or more example implementations of the subject matter disclosed herein.

One or more example aspects are represented in FIG. 21, and can correspond to a system comprising a traveling wave device 2102 configured to analyze traveling wave data representative of a traveling wave corresponding to a fault on a power transmission system. The traveling wave device 2102 can comprise a processor 2104, and a wavelet transform component 2106 that, via the processor 2104, transforms the traveling wave data into wavelet transform results. The traveling wave device 2102 can comprise protection components 2108 that use the wavelet transform results to output tripping signals for power transmission system protection, wherein the protection components can comprise a traveling wave-based distance protection component 2110, a traveling wave-based boundary protection component 2112, a traveling wave-based differential protection component 2114, and a traveling wave-based polarization-based protection component 2116.

The traveling wave device can be further configured to maintain a digital representation of the traveling wave data in storage for offline fault location determination.

Figure 22:
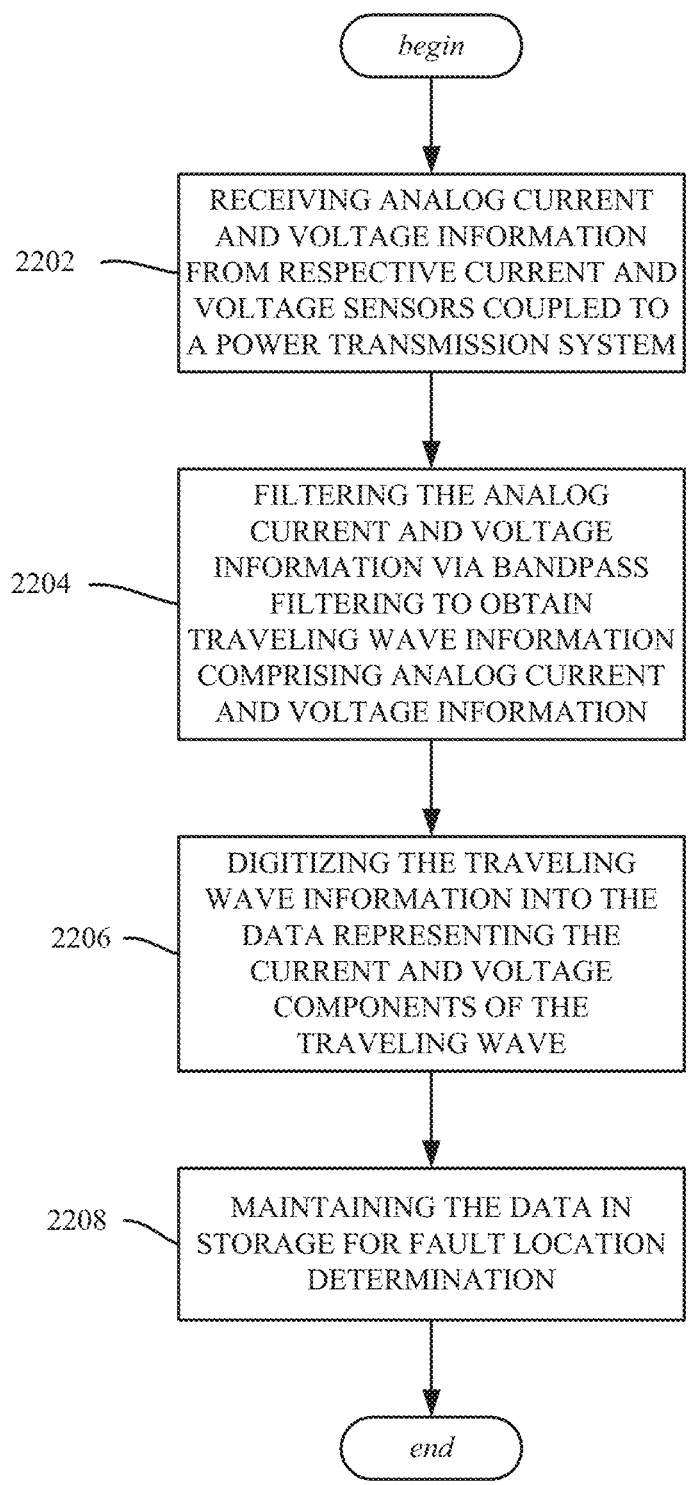
FIG. 22 is a flow diagram representation of various aspects related to using a traveling wave for fault location, in accordance with one or more example implementations of the subject matter disclosed herein.

One or more aspects, such as implemented in a machine-readable storage medium, comprising executable instructions that, when executed by a processor, facilitate performance of operations, are represented in FIG. 22. Example operations comprise operation 2202, which represents receiving analog current and voltage information from respective current and voltage sensors coupled to a power transmission system. Operation 2204 represents filtering the analog current and voltage information via bandpass filtering to obtain traveling wave information comprising analog current and voltage information. Operation 2206 represents digitizing the traveling wave information into the data representing the current and voltage components of the traveling wave. Operation 2208 represents maintaining the data in storage for fault location determination.

Further operations can comprise, transforming the data via an $\alpha$-$\beta$ transform into spatial vectors comprising a current vector and a voltage vector, transforming the data via a wavelet transform into wavelet transform results, and using the wavelet transform results for protection of the power transmission system.

As can be seen, the technology described herein facilitates a system that facilitates various types of traveling wave-based based protection for various types of faults. The technology described herein facilitates accurate fault location.

Figure 23:
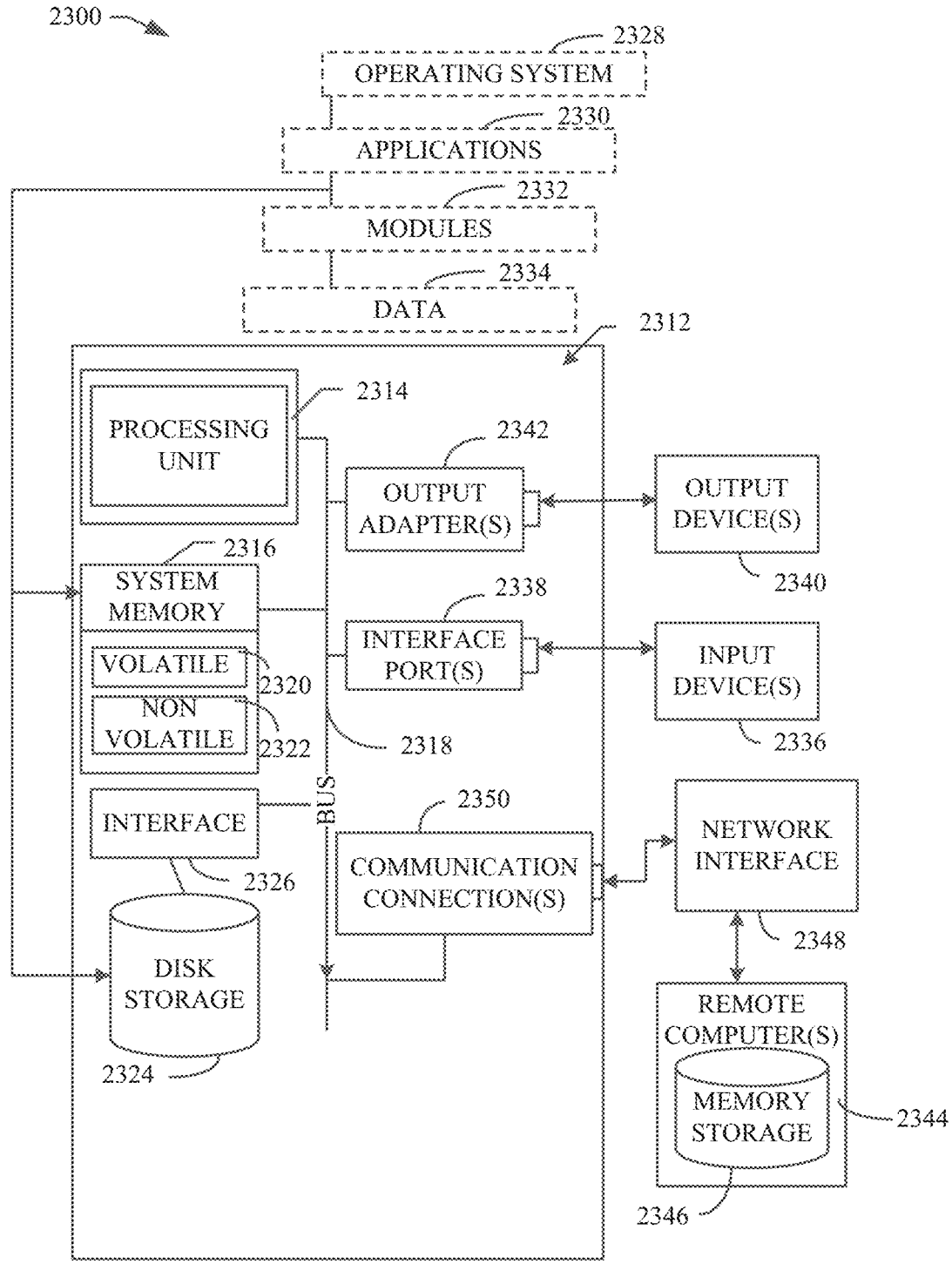
FIG. 23 is a schematic block diagram illustrating a suitable operating environment, in which various example aspects of the disclosed subject matter may be practiced.

In order to provide a context for the various aspects of the disclosed subject matter, FIG. 23, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules include routines, programs, components, data structures, etc. that performs particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can include both volatile and nonvolatile memory, by way of illustration, and not limitation, volatile memory 2320 (see below), non-volatile memory 2322 (see below), disk storage 2324 (see below), and memory storage 2346 (see below). Further, nonvolatile memory can be included in read only memory, programmable read only memory, electrically programmable read only memory, electrically erasable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, including single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 23 illustrates a block diagram of a computing system 2300 operable to execute the disclosed systems and methods in accordance with an embodiment. Computer 2312 includes a processing unit 2314, a system memory 2316, and a system bus 2318. System bus 2318 couples system components including, but not limited to, system memory 2316 to processing unit 2314. Processing unit 2314 can be any of various available processors. Dual microprocessors and other multiprocessor architectures also can be employed as processing unit 2314.

System bus 2318 can be any of several types of bus structure(s) including a memory bus or a memory controller, a peripheral bus or an external bus, and/or a local bus using any variety of available bus architectures including, but not limited to, industrial standard architecture, micro-channel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 2494), and small computer systems interface.

System memory 2316 can include volatile memory 2320 and nonvolatile memory 2322. A basic input/output system, containing routines to transfer information between elements within computer 2312, such as during start-up, can be stored in nonvolatile memory 2322. By way of illustration, and not limitation, nonvolatile memory 2322 can include read only memory, programmable read only memory, electrically programmable read only memory, electrically erasable read only memory, or flash memory. Volatile memory 2320 includes read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, Synchlink dynamic read only memory, Rambus direct read only memory, direct Rambus dynamic read only memory, and Rambus dynamic read only memory.

Computer 2312 can also include removable/non-removable, volatile/non-volatile computer storage media. FIG. 23 illustrates, for example, disk storage 2324. Disk storage 2324 includes, but is not limited to, devices like a magnetic disk drive, floppy disk drive, tape drive, flash memory card, or memory stick. In addition, disk storage 2324 can include storage media separately or in combination with other storage media including, but not limited to, an optical disk drive such as a compact disk read only memory device, compact disk recordable drive, compact disk rewritable drive or a digital versatile disk read only memory. To facilitate connection of the disk storage devices 2324 to system bus 2318, a removable or non-removable interface is typically used, such as interface 2326.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can include non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

It can be noted that FIG. 23 describes software that acts as an intermediary between users and computer resources described in suitable operating environment 2300. Such software includes an operating system 2328. Operating system 2328, which can be stored on disk storage 2324, acts to control and allocate resources of computer system 2312.

System applications 2330 take advantage of the management of resources by operating system 2328 through program modules 2332 and program data 2334 stored either in system memory 2316 or on disk storage 2324. It is to be noted that the disclosed subject matter can be implemented with various operating systems or combinations of operating systems.

A user can enter commands or information into computer 2312 through input device(s) 2336. As an example, a user interface can be embodied in a touch sensitive display panel allowing a user to interact with computer 2312. Input devices 2336 include, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 2314 through system bus 2318 by way of interface port(s) 2338. Interface port(s) 2338 include, for example, a serial port, a parallel port, a game port, a universal serial bus, an infrared port, a Bluetooth port, an IP port, or a logical port associated with a wireless service, etc. Output device(s) 2340 use some of the same type of ports as input device(s) 2336.

Thus, for example, a universal serial busport can be used to provide input to computer 2312 and to output information from computer 2312 to an output device 2340. Output adapter 2342 is provided to illustrate that there are some output devices 2340 like monitors, speakers, and printers, among other output devices 2340, which use special adapters. Output adapters 2342 include, by way of illustration and not limitation, video and sound cards that provide means of connection between output device 2340 and system bus 2318. It should be noted that other devices and/or systems of devices provide both input and output capabilities such as remote computer(s) 2344.

Computer 2312 can operate in a networked environment using logical connections to one or more remote computers, such as remote computer(s) 2344. Remote computer(s) 2344 can be a personal computer, a server, a router, a network PC, cloud storage, cloud service, a workstation, a microprocessor based appliance, a peer device, or other common network node and the like, and typically includes many or all of the elements described relative to computer 2312.

For purposes of brevity, only a memory storage device 2346 is illustrated with remote computer(s) 2344. Remote computer(s) 2344 is logically connected to computer 2312 through a network interface 2348 and then physically connected by way of communication connection 2350. Network interface 2348 encompasses wire and/or wireless communication networks such as local area networks and wide area networks. Local area network technologies include fiber distributed data interface, copper distributed data interface, Ethernet, Token Ring and the like. Wide area network technologies include, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 2350 refer(s) to hardware/software employed to connect network interface 2348 to bus 2318. While communication connection 2350 is shown for illustrative clarity inside computer 2312, it can also be external to computer 2312. The hardware/software for connection to network interface 2348 can include, for example, internal and external technologies such as modems, including regular telephone grade modems, cable modems and digital subscriber line modems, integrated services digital network adapters, and Ethernet cards.

Figure 24:
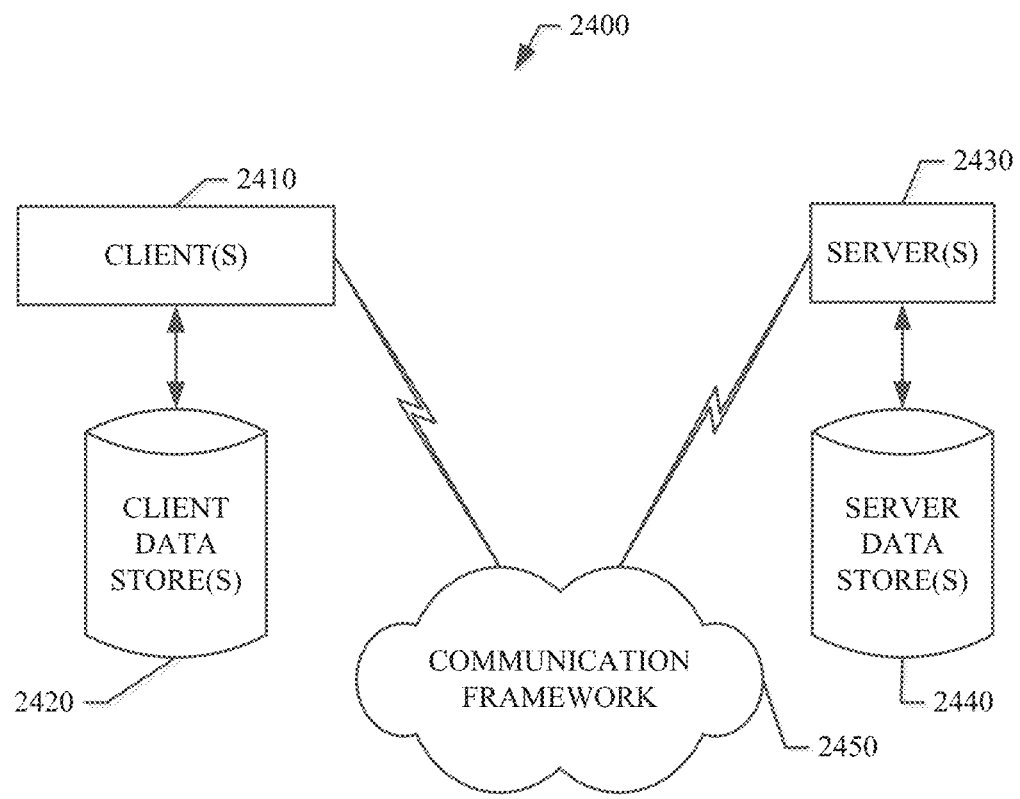
FIG. 24 is a schematic block diagram of an example computing environment, in which various example aspects of the disclosed subject matter may be practiced.

FIG. 24 is a schematic block diagram of a sample-computing environment 2400 with which the subject matter of this disclosure can interact. The system 2400 includes one or more client(s) 2410. The client(s) 2410 can be hardware and/or software (e.g., threads, processes, computing devices). The system 2400 also includes one or more server(s) 2430. Thus, system 2400 can correspond to a two-tier client server model or a multi-tier model (e.g., client, middle tier server, data server), amongst other models. The server(s) 2430 can also be hardware and/or software (e.g., threads, processes, computing devices). The servers 2430 can house threads to perform transformations by employing this disclosure, for example. One possible communication between a client 2410 and a server 2430 may be in the form of a data packet transmitted between two or more computer processes.

The system 2400 includes a communication framework 2450 that can be employed to facilitate communications between the client(s) 2410 and the server(s) 2430. The client(s) 2410 are operatively connected to one or more client data store(s) 2420 that can be employed to store information local to the client(s) 2410. Similarly, the server(s) 2430 are operatively connected to one or more server data store(s) 2440 that can be employed to store information local to the servers 2430.

Figure 25:
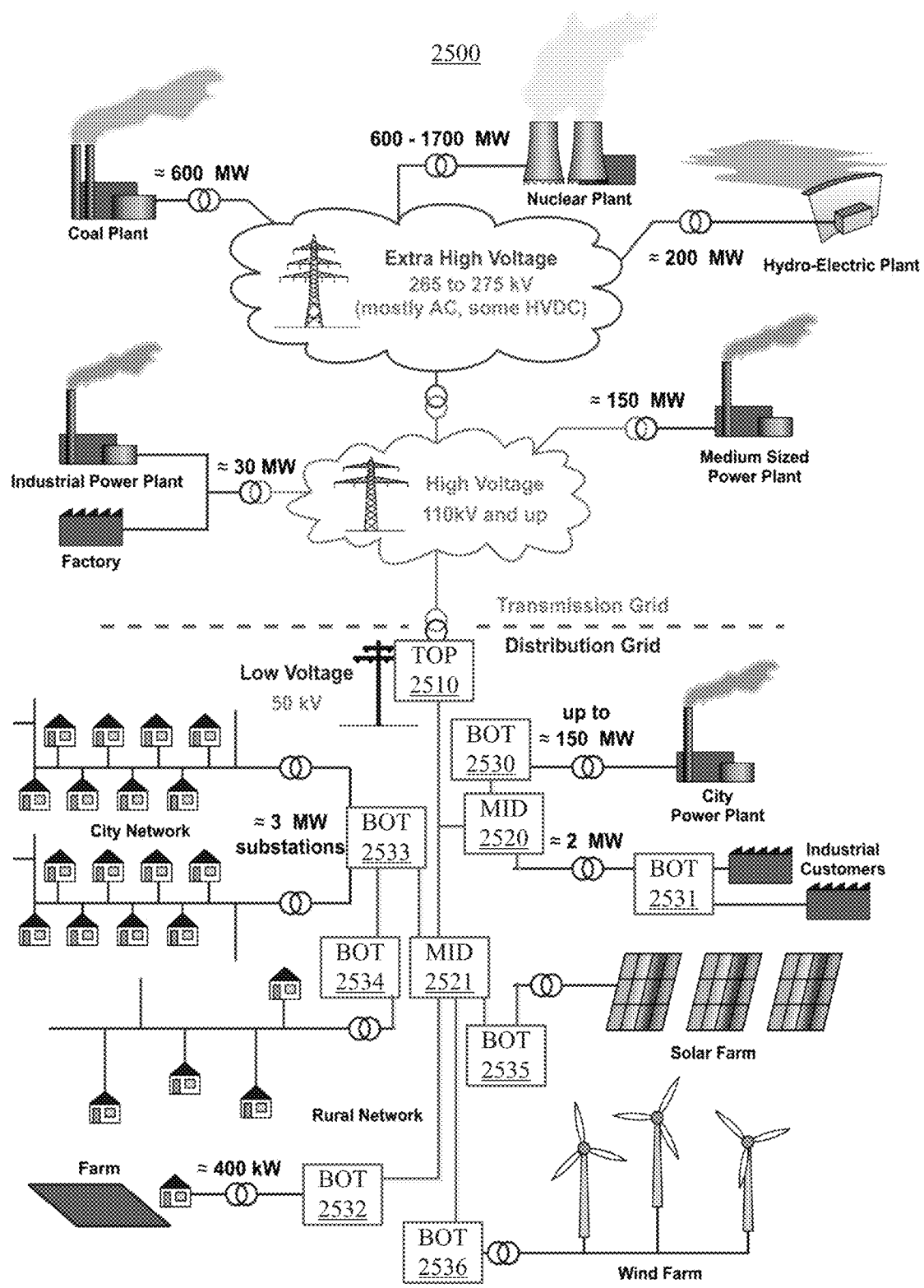
FIG. 25 depicts a diagram of an example electrical grid environment, in which various example aspects of the disclosed subject matter may be practiced.

FIG. 25 depicts a diagram of an example electrical grid environment 2500 in which the various aspects of the disclosed subject matter can be practiced. It is to be appreciated that this figure and the associated disclosure is presented as a non-limiting example to facilitate a general comprehension of one or more aspects of the disclosed subject matter in connection with hypothetical electrical grid assets. Further, while sample values and assets are illustrated for context, these same sample values and assets are non-limiting and should not be viewed as defining any narrowing of scope. Generally, the assets of FIG. 25 can be assigned to a transmission grid portion (upper portion of figure) or a distribution grid portion (lower portion of figure) as is typical in many electrical power grids worldwide. Transmission systems often are associated with very high AC voltages or even DC transmission of power. Transmission systems are generally presented in the context of delivering high power to regional distribution networks managed by a distribution grid entity.

The conventional electrical distribution grid, as disclosed herein, generally has a flat control structure with control being centralized in a distribution control center (DCC). In contrast, as illustrated in FIG. 25, a non-flat control topography can be employed in accord with the subject matter disclosed herein. In this non-limiting example, three tiers of electrical distribution control system components are illustrated. A top-level (e.g., upper level) control node 2510 (also referred to as TOP 2510) (e.g., comprising a top-level DNNC component and top-level PSBC) can be communicatively coupled to junior level control nodes (e.g., 2520 to 2536), which can comprise junior level DNNC components and junior level PSBCs. In FIG. 25, the interconnections illustrate a basic tree structure topology.

In an aspect, two mid-level control nodes 2520 (also referred to as MID 2520) and 2521 (also referred to as MID 2521) can be logically placed between the bottom-level (e.g., lower level) control node and the top-level control node 2510. Further, the several bottom-level control nodes, such as bottom-level control nodes 2530 through 2536 (also referred to as BOT 2530 through BOT 2536), can be associated with various edge assets. For example, bottom-level control node 2530 can be associated with a city power plant and bottom-level control node 2531 can be associated with a small group of industrial customers. Bottom-level control node 2530 and 2531 can be logically connected to top-level control node 2510 by way of mid-level control node 2520. As such, data and rules can be bubbled up (e.g., communicated upward in the hierarchy) or pushed down (e.g., communicated downward in the hierarchy) by way of this communication path. The bidirectional communication and closed loop control at each level (e.g., top, mid, and bottom) can facilitate improved electrical distribution grid performance. For example, where additional power is needed by the industrial customers associated with bottom-level control node 2531, control signals from mid-level control node 2520 can source more power from city power plant by way of bottom-level control node 2530 without directly involving the top-level control node 2510 or draining energy from the illustrated solar farm or wind farm.

Similarly, mid-level control node 2521 can be associated with bottom-level control node 2532 through 2536. Bottom-level control node 2533, for example, can be logically associated with a plurality of transformers service a portion of a city network. Further, for example, bottom-level control node 2534 can be associated with a single transformer as part of a rural network. Moreover, at bottom-level control node 2532, for example, the control node can be associated with a single consumer, such as the farm. The control nodes also can be associated with distributed power generation, for example bottom-level control node 2535 associated with a solar farm and bottom-level control node 2536 associated with a wind farm. As such, bidirectional communication between top-level control node 2510 and bottom-level control node 2532 through 2536 can be by way of mid-level control node 2521. As such, rules propagated for mid-level control node 2520 and associate child control nodes can be different from rules propagated for mid-level control node 2521 and associated child control nodes. Further, independent closed loop control can be affected, for example, at bottom-level control node 2534 and the associated rural customers without impacting bottom-level control node 2533 and the associated city network.

It is to be noted that aspects or features of this disclosure can be exploited in substantially any wireless telecommunication or radio technology, e.g., Wi-Fi; Bluetooth; Worldwide Interoperability for Microwave Access (WiMAX); Enhanced General Packet Radio Service (Enhanced GPRS); Third Generation Partnership Project (3GPP) Long Term Evolution (LTE); Third Generation Partnership Project 2 (3GPP2) Ultra Mobile Broadband (UMB); 3GPP Universal Mobile Telecommunication System (UMTS); High Speed Packet Access (HSPA); High Speed Downlink Packet Access (HSDPA); High Speed Uplink Packet Access (HSUPA); GSM (Global System for Mobile Communications) EDGE (Enhanced Data Rates for GSM Evolution) Radio Access Network (GERAN); UMTS Terrestrial Radio Access Network (UTRAN); LTE Advanced (LTE-A); etc. Additionally, some or all of the aspects described herein can be exploited in legacy telecommunication technologies, e.g., GSM. In addition, mobile as well non-mobile networks (e.g., the Internet, data service network such as internet protocol television (IPTV), etc.) can exploit aspects or features described herein.

While the subject matter has been described above in the general context of computer-executable instructions of a computer program that runs on a computer and/or computers, those skilled in the art will recognize that this disclosure also can or may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., PDA, phone), microprocessor-based or programmable consumer or industrial electronics, and the like. The illustrated aspects may also be practiced in distributed computing environments where tasks are performed by remote processing devices that are linked through a communications network. However, some, if not all aspects of this disclosure can be practiced on stand-alone computers. In a distributed computing environment, program modules may be located in both local and remote memory storage devices.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "operator," "switchman," "consumer," "prosumer," "agent," and the like are employed interchangeably throughout the subject specification, unless context warrants particular distinction(s) among the terms. It should be appreciated that such terms can refer to human entities or automated components (e.g., supported through artificial intelligence, as through a capacity to make inferences based on complex mathematical formalisms), that can provide simulated vision, sound recognition and so forth.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

While the invention is susceptible to various modifications and alternative constructions, certain illustrated implementations thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

In addition to the various implementations described herein, it is to be understood that other similar implementations can be used or modifications and additions can be made to the described implementation(s) for performing the same or equivalent function of the corresponding implementation(s) without deviating therefrom. Accordingly, the invention is not to be limited to any single implementation, but rather is to be construed in breadth, spirit and scope in accordance with the appended claims.

What is claimed is:

1. A method, comprising:
    analyzing, by a system comprising a processor, a traveling wave corresponding to a fault on a power transmission system, comprising,
        receiving data representing current and voltage components of the traveling wave;
        maintaining the data in storage for fault location determination of the fault;
        transforming the data, including transforming via a wavelet transform, into wavelet transform results;
        determining that the traveling wave corresponds to an internal fault based on a first end of the traveling wave and a second end of the traveling wave having a same polarization; and
        using the wavelet transform results for protection of the power transmission system, wherein the using the wavelet transform results for the protection of the power transmission system comprises:
            formulating forward and backward traveling wave information based on a fourth scale of the wavelet transform results of voltage traveling waves and a fourth scale of the wavelet transform results of current traveling waves multiplied by a system surge impedance value, wherein the fourth scale of the wavelet transform results comprises the traveling wave passed through a first bandpass filter having a first frequency band of ($\frac{1}{32}$ of a sampling frequency, $\frac{1}{16}$ of the sampling frequency);
            using the forward and backward traveling wave information to obtain differential traveling wave information and bias traveling wave information;
            using the differential traveling wave information and the bias traveling wave information for traveling wave-based differential protection; and
            using a first scale of and the fourth scale of the wavelet transform results of current traveling waves for traveling wave-based boundary protection, wherein the first scale of the wavelet transform results comprises the traveling wave passed through a second bandpass filter having a second frequency band of ($\frac{1}{2}$ of the sampling frequency, $\frac{1}{4}$ of the sampling frequency).

2. The method of claim 1, further comprising, receiving analog current and voltage information from respective current and voltage sensors coupled to the power transmission system, filtering the analog current and voltage information via bandpass filtering to obtain traveling wave information comprising analog current and voltage information, and digitizing the traveling wave information into the data representing the current and voltage components of the traveling wave.

3. The method of claim 1, wherein the transforming the data, including transforming via the wavelet transform, comprises transforming the data via an α-β transform into spatial vectors comprising a current vector and a voltage vector, and performing the wavelet transform on the current vector and the voltage vector into the wavelet transform results.

4. The method of claim 1, wherein the using the wavelet transform results for the protection of the power transmission system comprises using a first scale of the wavelet transform results of voltage traveling waves and the first scale of the wavelet transform results of current traveling waves for traveling wave-based distance protection.

5. The method of claim 1, wherein the using the wavelet transform results for the protection of the power transmission system comprises using down-sampled values corresponding to forward and backward traveling waves to determine fault-induced traveling wave direction.

6. The method of claim 5, wherein the using the wavelet transform results for the protection of the power transmission system further comprises using the traveling wave direction data for direction-comparison-based protection that compares the fault directions made by traveling waves at ends of the transmission system.

7. The method of claim 1, wherein the using the wavelet transform results for the protection of the power transmission system comprises comparing a first polarization of the first end of the traveling wave and a second polarization of the second end of the traveling wave to perform polarization comparison protection.

8. The method of claim 1, wherein the using the wavelet transform results for the protection of the power transmission system comprises performing unit protection to output a tripping signal within a defined boundary.

9. The method of claim 1, wherein the using the wavelet transform results for the protection of the power transmission system comprises performing non-unit protection to output a tripping signal.

10. The method of claim 1, wherein the maintaining the data in the storage for the fault location determination comprises providing time-based snapshot data to a single-ended traveling wave fault locator.

11. The method of claim 1, wherein the maintaining the data in the storage for the fault location determination comprises providing time-based snapshot data to a double-ended traveling wave fault locator.

12. The method of claim 11, further comprising, obtaining a real fault distance value, and using the real fault distance value to improve fault location accuracy.

13. The method of claim 1, wherein the maintaining the data in the storage for the fault location determination comprises providing time-based snapshot data to a multi-ended traveling wave fault locator.

14. The method of claim 13, further comprising, iterating, by the multi-ended traveling wave fault locator, over a group of junction points corresponding to traveling wave devices deployed at multiple ends to locate a fault section.

15. A system, comprising,
 a traveling wave device configured to analyze traveling wave data representative of a traveling wave corresponding to a fault on a power transmission system, the traveling wave device comprising:
  a processor,
  a wavelet transform component that, via the processor, transforms the traveling wave data into wavelet transform results, wherein the wavelet transform results use a first scale of and a fourth scale of the wavelet transform results for traveling wave-based boundary protection, and
  protection components that use the wavelet transform results to output tripping signals for power transmission system protection, wherein the protection components comprise a traveling wave-based distance protection component, a traveling wave-based boundary protection component, a traveling wave-based differential protection component, and a traveling wave-based polarization-based protection component,
  wherein the traveling wave device determines that the traveling wave corresponds to an internal fault based on a first end of the traveling wave and a second end of the traveling wave having a same polarization, and
  wherein the traveling wave device formulates forward and backward traveling wave information based on a fourth scale of the wavelet transform results of voltage traveling waves and a fourth scale of the wavelet transform results of current traveling waves multiplied by a system surge impedance value, uses the forward and backward traveling wave information to obtain differential traveling wave information and bias traveling wave information, uses the differential traveling wave information and the bias traveling wave information for traveling wave-based differential protection, and uses a first scale of and the fourth scale of the wavelet transform results of current traveling waves for traveling wave-based boundary protection, wherein the fourth scale of the wavelet transform results comprises the traveling wave passed through a first bandpass filter having a first frequency band of ($\frac{1}{32}$ of a sampling frequency, $\frac{1}{16}$ of the sampling frequency), and wherein the first scale of the wavelet transform results comprises the traveling wave passed through a second bandpass filter having a second frequency band of ($\frac{1}{2}$ of the sampling frequency, $\frac{1}{4}$ of the sampling frequency).

16. The system of claim 15, wherein the traveling wave device is further configured to maintain a digital representation of the traveling wave data in storage for offline fault location determination.

17. A machine-readable storage media, comprising executable instructions that, in response to execution, cause a device comprising a processor to perform operations, the operations comprising:
 receiving analog current and voltage information from respective current and voltage sensors coupled to a power transmission system;
 filtering the analog current and voltage information via bandpass filtering to obtain traveling wave information comprising analog current and voltage information;
 digitizing the traveling wave information into the data representing the current and voltage components of the traveling wave;
 maintaining the data in storage for fault location determination;
 transforming the data, including transforming via a wavelet transform, into wavelet transform results; and
 using the wavelet transform results for protection of the power transmission system, wherein the using the wavelet transform results for the protection of the power transmission system comprises:

formulating forward and backward traveling wave information based on a fourth scale of the wavelet transform results of voltage traveling waves and a fourth scale of the wavelet transform results of current traveling waves multiplied by a system surge impedance value, wherein the fourth scale of the wavelet transform results comprises the traveling wave passed through a first bandpass filter having a first frequency band of ($\frac{1}{32}$ of a sampling frequency, $\frac{1}{16}$ of the sampling frequency);

using the forward and backward traveling wave information to obtain differential traveling wave information and bias traveling wave information;

using the differential traveling wave information and the bias traveling wave information for traveling wave-based differential protection; and using a first scale of and the fourth scale of the wavelet transform results of current traveling waves for traveling wave-based boundary protection, wherein the first scale of the wavelet transform results comprises the traveling wave passed through a second bandpass filter having a second frequency band of ($\frac{1}{2}$ of the sampling frequency, $\frac{1}{4}$ of the sampling frequency).

18. The machine-readable storage media of claim 17, where the operations further comprise, transforming the data via an $\alpha$-$\beta$ transform into spatial vectors comprising a current vector and a voltage vector.

\* \* \* \* \*